(12) United States Patent
Han et al.

(10) Patent No.: US 8,669,165 B2
(45) Date of Patent: Mar. 11, 2014

(54) METHOD OF FABRICATING SEMICONDUCTOR DEVICE USING DEUTERIUM ANNEALING

(75) Inventors: Seung-Uk Han, Suwon-si (KR); Nam-Ho Jeon, Hwaseong-si (KR); Satoru Yamada, Seoul (KR); Young-Jin Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 168 days.

(21) Appl. No.: 13/216,706

(22) Filed: Aug. 24, 2011

(65) Prior Publication Data

US 2012/0142160 A1 Jun. 7, 2012

(30) Foreign Application Priority Data

Dec. 2, 2010 (KR) .................. 10-2010-0122070

(51) Int. Cl.
*H01L 21/02* (2006.01)
(52) U.S. Cl.
USPC .................. 438/381; 257/E21.008
(58) Field of Classification Search
USPC ............. 438/381, 585; 257/E21.008, E21.19
See application file for complete search history.

(56) References Cited

U.S. PATENT DOCUMENTS

| 6,521,977 B1 | 2/2003 | Burnham et al. |
| 6,770,501 B2 | 8/2004 | Burnham et al. |
| 2002/0177290 A1* | 11/2002 | Ramkumar et al. .......... 438/530 |
| 2003/0102529 A1 | 6/2003 | Burnham et al. |
| 2005/0202686 A1* | 9/2005 | Saki et al. ..................... 438/783 |
| 2007/0020920 A1* | 1/2007 | Palsule et al. ................. 438/636 |
| 2007/0235421 A1* | 10/2007 | Sugawara et al. ........ 219/121.36 |
| 2007/0267674 A1* | 11/2007 | Lin et al. ....................... 257/306 |

FOREIGN PATENT DOCUMENTS

| JP | 2003224206 | 8/2003 |
| JP | 3578401 | 7/2004 |
| KR | 100389604 | 6/2003 |
| KR | 1020100075105 | 7/2010 |

OTHER PUBLICATIONS

Mogul, H. C. et al., "Electrical and Physical Characterization of Deuterium Sinter on Submicron Devices", American Institute of Physics, vol. 72, No. 14, Apr. 6, 1998, pp. 1721-1723.

\* cited by examiner

*Primary Examiner* — William D Coleman
*Assistant Examiner* — Christine Enad
(74) *Attorney, Agent, or Firm* — Onello & Mello, LLP

(57) ABSTRACT

A method of fabricating a semiconductor device is disclosed, the method generally including the steps of: forming a gate dielectric layer on a semiconductor substrate; forming a gate electrode on the gate dielectric layer; forming an etch stop layer on the gate electrode; forming a capacitor on the semiconductor substrate adjacent to the gate electrode; after forming the capacitor, forming a contact hole passing through the etch stop layer on the gate electrode; and, diffusing deuterium into the gate dielectric layer through the contact hole.

18 Claims, 21 Drawing Sheets

METHOD OF FABRICATING SEMICONDUCTOR DEVICE USING DEUTERIUM ANNEALING

CROSS-REFERENCE TO RELATED APPLICATION

This application claims priority under 35 U.S.C. §119 to Korean Patent Application No. 10-2010-0122070 filed on Dec. 2, 2010, the disclosure of which is hereby incorporated by reference in its entirety.

FIELD

Exemplary embodiments of the inventive concept relate to a method of fabricating a semiconductor device using deuterium annealing and to an electronic device employing the same.

BACKGROUND

It is known to form PMOS transistors on semiconductor substrates and to use those transistors to fabricate other types of semiconductor devices. For example, in fabricating a DRAM device, a capacitor is formed on a transistor, which process includes a step of forming a dielectric layer on the transistor. In one typical such process, the dielectric layer is formed at a relatively high temperature, which may, for example, be a temperature of about 650° C. or higher.

At the same time, however, carrying out the dielectric layer formation step at the relatively high temperature of about 650° C. or higher can adversely affect the properties and/or the performance of the transistor on which the dielectric layer is being formed. For example, if the transistor has undergone a hydrogen annealing treatment to improve the properties of the transistor prior to the step of forming the dielectric layer, the high temperature of the dielectric layer formation step can cause hydrogen out-gasing and resulting deterioration of the transistor's properties.

SUMMARY

Embodiments of the present inventive concepts relate generally to deuterium ($D_2$) annealing techniques for improving the characteristics of a PMOS or similar transistor and for reducing the possible adverse impact on the transistor of a high-temperature process step, such as a step of forming a dielectric layer on the transistor.

Exemplary embodiments of the inventive concept provide a method of fabricating a semiconductor device which can improve characteristics of a transistor.

The inventive concept of this application is not limited to the exemplary embodiments described herein. Other exemplary embodiments which are not mentioned will be clearly understood by those skilled in the art in conjunction with the following descriptions, and all such embodiments are intended to be included.

In accordance with an aspect of the inventive concept, a first method of fabricating a semiconductor device is provided. The first method includes a step of forming a gate dielectric layer on a semiconductor substrate. A gate electrode is then formed on the gate dielectric layer. An etch stop layer is thereafter formed on the gate electrode. A capacitor is then formed on the semiconductor substrate adjacent to the gate electrode. After forming the capacitor, a contact hole passing through the etch stop layer is formed on the gate electrode, and deuterium is diffused into the gate dielectric layer through the contact hole.

In some embodiments, following the deuterium diffusion step, a content of the deuterium in the parts of the gate dielectric layer may vary, decreasing as the parts of the gate dielectric layer are disposed further apart from the contact hole.

In some embodiments, the diffusion of the deuterium may include a step of performing a first deuterium annealing process on the semiconductor substrate having the contact hole at a temperature of about 300° C. to about 700° C.

In some embodiments, an upper plug may be formed in the contact hole. A second deuterium annealing process may then be performed on the semiconductor substrate having the upper plug. The upper plug may be formed by a relatively low temperature process at about 400° C. or less.

In some embodiments, an upper interconnection may be formed on the upper plug as referenced above. A passivation layer may then be formed on the upper interconnection. The upper interconnection and the passivation layer may be formed by a relatively low temperature process at about 400° C. or less.

In some embodiments, an upper insulating layer may be formed on the capacitor and the etch stop layer. The contact hole as referenced above may pass through the upper insulating layer.

In some embodiments, the formation of the capacitor may include a step of forming a storage node. A capacitor dielectric layer may then be formed on the storage node. A plate electrode may thereafter be formed on the capacitor dielectric layer. The capacitor dielectric layer may be interposed between the storage node and the plate electrode.

In some embodiments, the formation of the capacitor dielectric layer as referenced above may include a step of performing a relatively high temperature process at about 450° C. to about 900° C. The capacitor dielectric layer may include a silicon oxide layer, a silicon nitride layer, a silicon oxynitride layer, a high-K dielectric layer, or any combination thereof.

In some embodiments, an intermediate interconnection may be formed on the gate electrode. The intermediate interconnection may be exposed in the contact hole. The intermediate interconnection may include an intermediate plug in contact with the gate electrode and a conductive line formed on the intermediate plug.

In some embodiments, a lower etch stop layer may be formed between the gate electrode and the conductive line. The intermediate plug may pass through the lower etch stop layer.

In some embodiments, the semiconductor substrate may include an N-type silicon layer. The etch stop layer of this embodiment may include a nitride layer.

In accordance with another aspect of the inventive concepts, a second method of fabricating a semiconductor device is provided. The second method includes a step of forming an isolation layer defining an N-type active region and a P-type active region in a semiconductor substrate. A gate dielectric layer is then formed on the N-type active region and the P-type active region. A gate electrode is then formed on the gate dielectric layer. An etch stop layer is thereafter formed on the gate electrode. A contact hole passing through the etch stop layer is then formed on the gate electrode, and deuterium is diffused into the gate dielectric layer through the contact hole.

In some embodiments, the contact hole may be disposed relatively close to the N-type active region, and disposed relatively apart from the P-type active region.

In some embodiments, before diffusing deuterium into the gate dielectric layer, active/passive elements may be formed on the semiconductor substrate adjacent to the gate electrode. The active/passive elements may be formed by a relatively high temperature process at about 450° C. to about 900° C. The active/passive elements may include a capacitor dielectric layer, a cell transistor, a diode, a photo diode, a charge trap layer, a phase change material layer, a ferroelectric layer, a magnetic tunnel junction device, a transition metal oxide layer, or a combination thereof In some embodiments, an upper insulating layer may be formed on the etch stop layer, and the contact hole may pass through the upper insulating layer.

In some embodiments, an upper plug may be formed in the contact hole, and a deuterium annealing process may be performed on the semiconductor substrate having the upper plug.

Furthermore, in accordance with still another aspect of the inventive concepts, a third method of fabricating a semiconductor device is provided. The third method includes a step of forming a gate dielectric layer on a semiconductor substrate. A gate electrode is then formed on the gate dielectric layer. An etch stop layer is thereafter formed on the gate electrode. A contact hole passing through the etch stop layer is then formed on the gate electrode. An upper plug is then formed in the contact hole, and deuterium is diffused into the gate dielectric layer through the upper plug and the contact hole.

In another aspect, in a process of fabricating a semiconductor device that comprises at least a gate dielectric layer on a semiconductor substrate, a gate electrode on the gate dielectric layer, and an etch stop layer on the gate electrode, and further comprises a high-temperature process component that is formed at a temperature of about 450° C. or higher, the improvements comprise the steps of: (a) after forming the high-temperature process component, forming one or more contact holes that pass through the etch stop layer and extend to or into the gate dielectric layer and/or extend to interconnections or interfaces that, in turn, extend to or into the gate dielectric layer; and (b) diffusing deuterium into the gate dielectric layer at least in part through the contact hole(s).

In some embodiments, the semiconductor substrate, the gate dielectric layer and the gate electrode comprise a transistor, and the improvement comprises the following additional steps after step (b) of diffusing deuterium into the gate dielectric layer: (c) forming an upper plug; (d) performing a second deuterium annealing step: (e) forming an upper interconnection; (f) carrying out a passivation step; and (g) performing an $H_2$ annealing step.

In some embodiments, the semiconductor substrate, the gate dielectric layer and the gate electrode comprise a transistor, and the improvement comprises the following additional steps after step (b) of diffusing deuterium into the gate dielectric layer: (c) forming an upper plug; (d) forming an upper interconnection; (e) carrying out a passivation step; and (f) performing an $H_2$ annealing step.

In some embodiments, after step (a) but prior to step (b), there is a step of forming an upper plug.

In some embodiments, the process further comprises the additional step of incorporating the semiconductor device into a memory module, a data storage device, or a communication device.

Particulars of the above and some of the other exemplary embodiments encompassed by the inventive concepts are incorporated in the following detailed description and drawings.

BRIEF DESCRIPTION OF THE DRAWINGS

The foregoing and other features and advantages of the several inventive concepts within the scope of this invention will be apparent from the following more particular description of exemplary embodiments of the inventive concepts, and as illustrated in the accompanying drawings in which like reference characters refer to the same or comparable parts throughout the different views. It will be understood that the drawings are not necessarily to scale, emphasis instead being placed upon illustrating the principles of the inventive concepts. In the drawings.

DETAILED DESCRIPTION OF EMBODIMENTS

Figure 1:
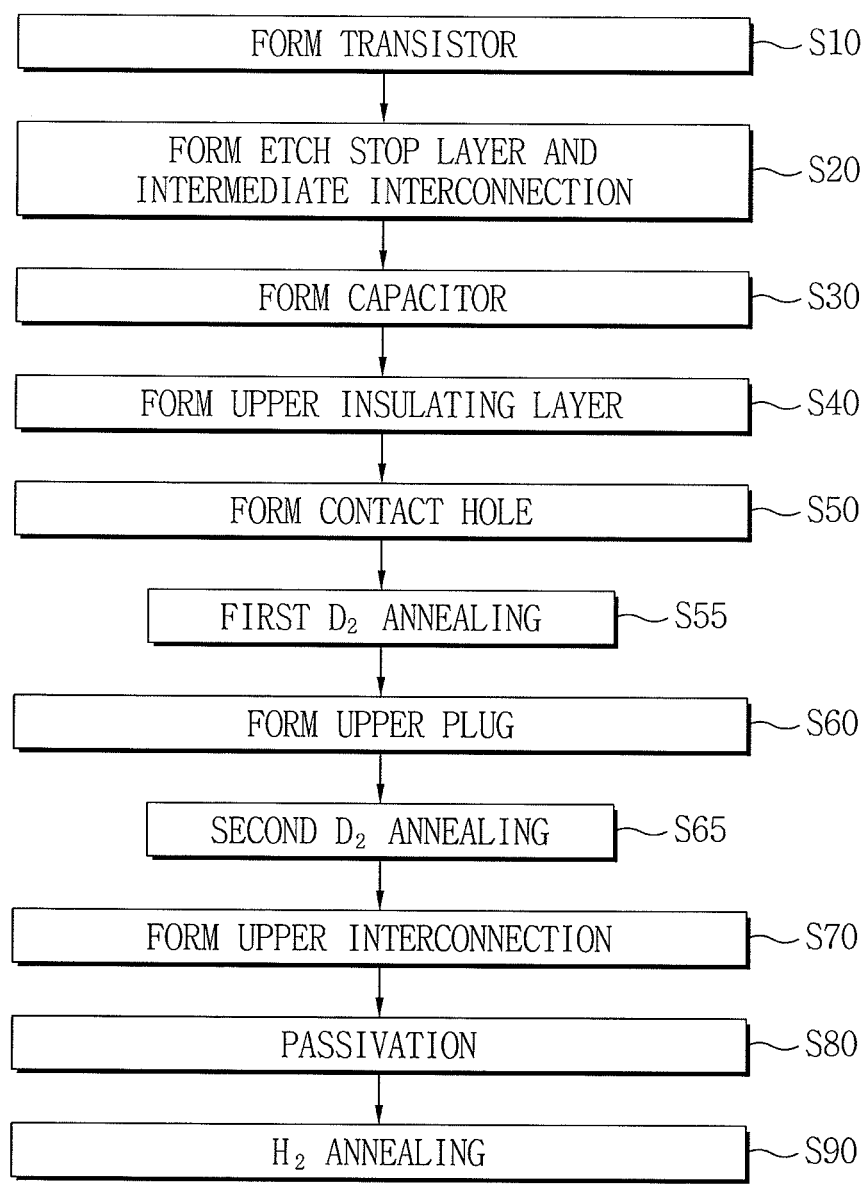
FIGS. 1, 7 and 8 are process flowcharts illustrating alternative methods of fabricating a semiconductor device according to a first exemplary embodiment of the inventive concept.

Various embodiments will now be described more fully with reference to the accompanying drawings in which some exemplary embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, will be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

[Exemplary Embodiment 1]

Figure 5:
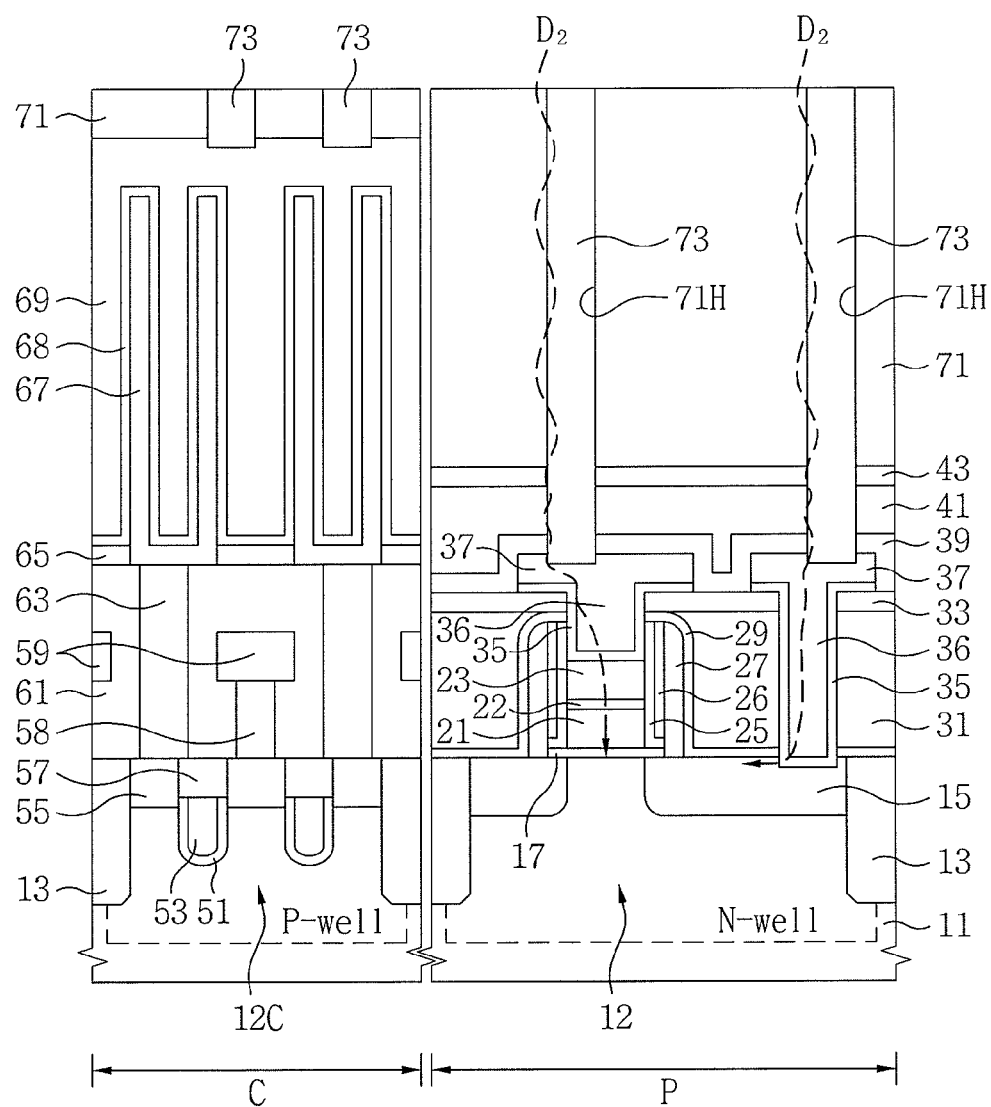
Figure 6:
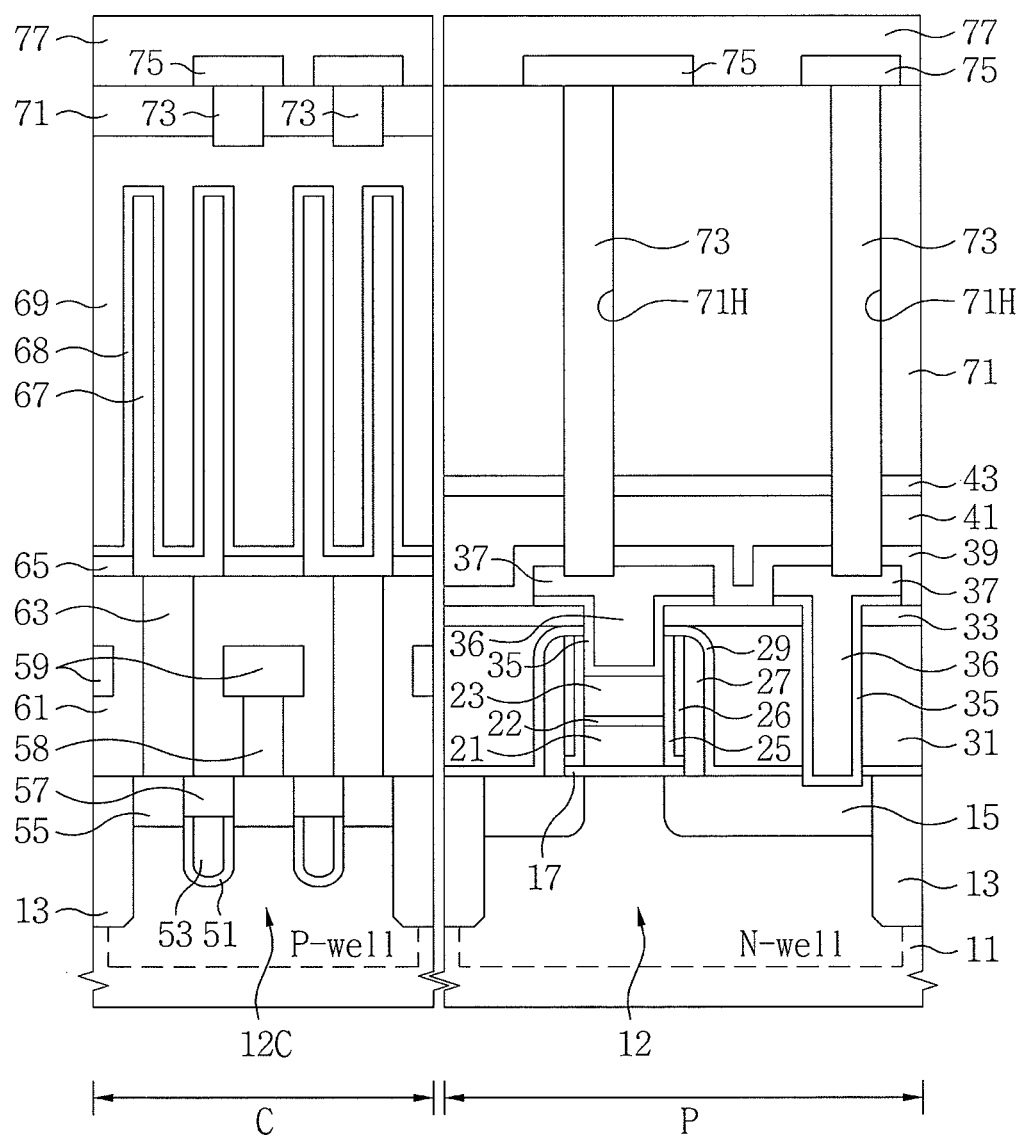
Figure 7:
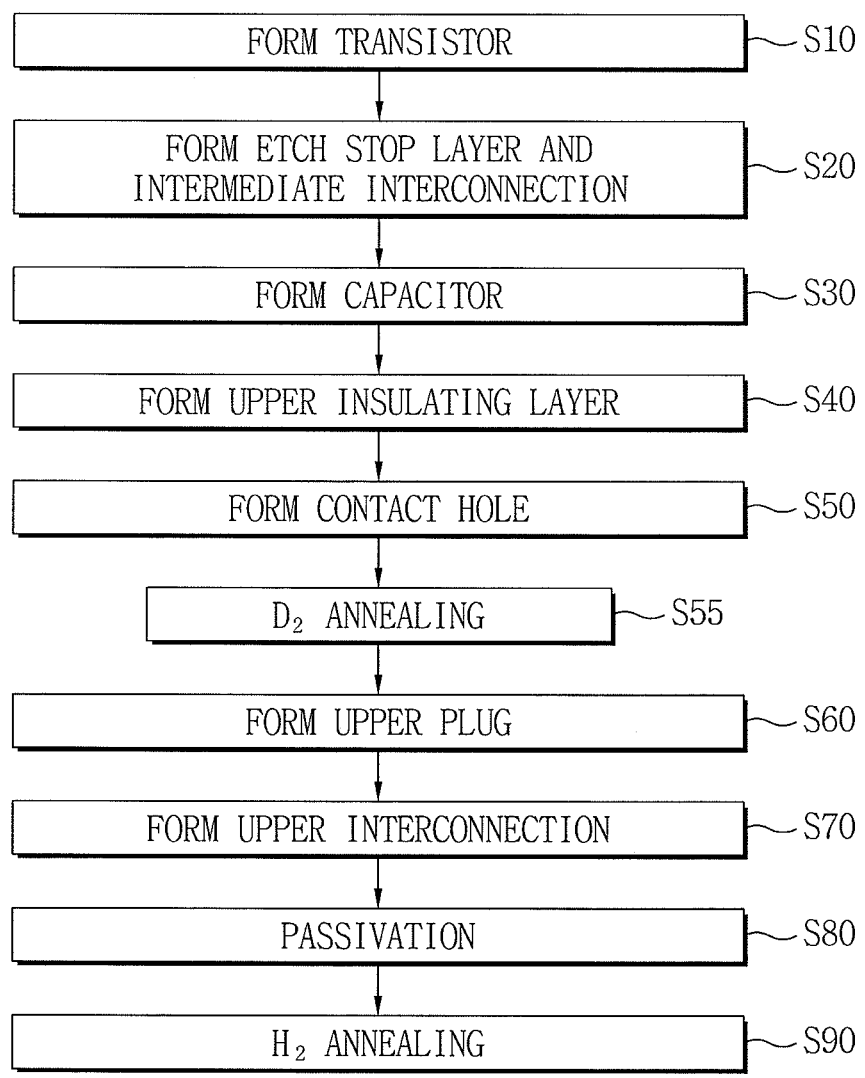
Figure 8:
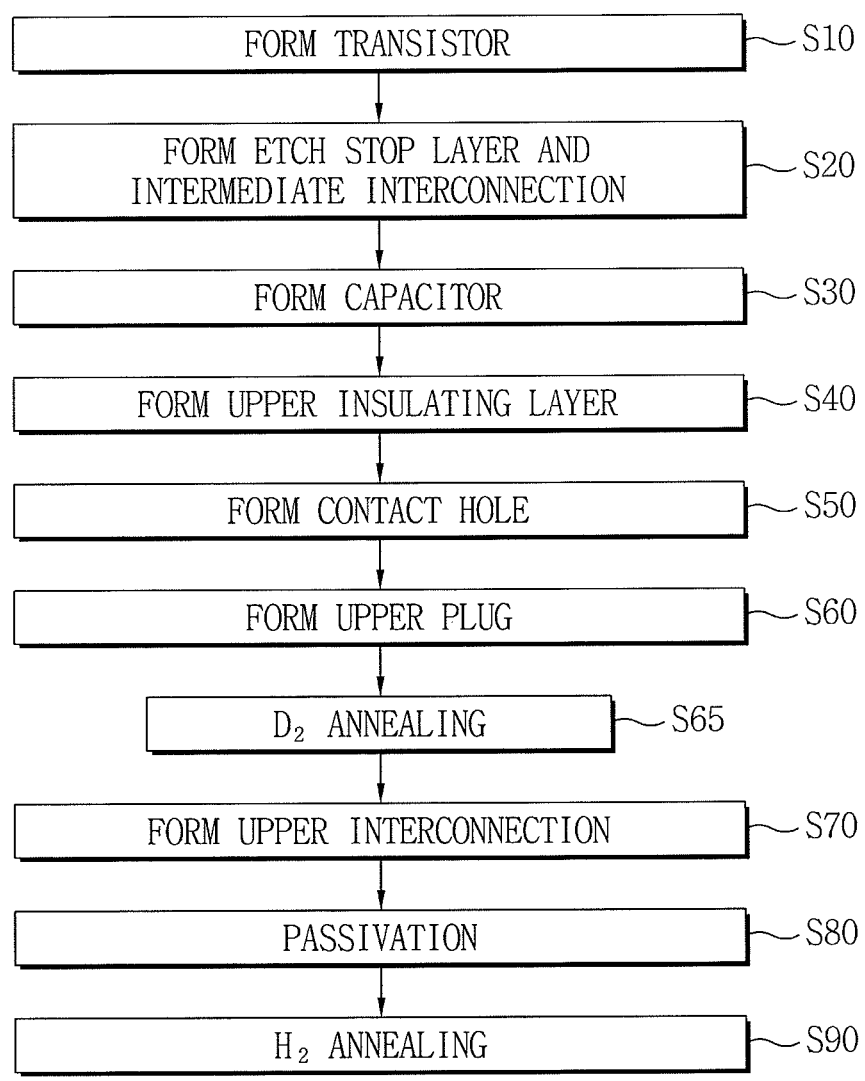

FIGS. 1, 7 and 8 are process flowcharts illustrating methods of fabricating a semiconductor device according to a first exemplary embodiment of the inventive concept, and FIGS. 2, 3, 5 and 6 are schematic cross-sectional views illustrating steps in the method of fabricating a semiconductor device according to the first exemplary embodiment of the inventive concept. Furthermore, FIG. 4 is an enlarged view illustrating a part of FIG. 3 in greater detail. The semiconductor device according to the first exemplary embodiment may be, for example, a dynamic random access memory (DRAM).

Referring to FIG. 1, one method of fabricating a semiconductor device according to the first exemplary embodiment may include a step of forming a transistor (S10), followed sequentially by the further steps of: forming an etch stop layer and an intermediate interconnection (S20), forming a capacitor (S30), forming an upper insulating layer (S40), forming a contact hole (S50), performing a first deuterium ($D_2$) annealing (S55), forming an upper plug (S60), performing second deuterium ($D_2$) annealing (S65), forming an upper interconnection (S70), forming a passivation layer (S80), and performing $H_2$ annealing (S90).

Referring to FIG. 7, another method of fabricating a semiconductor device according to the first exemplary embodiment may include a step of forming a transistor (S10), followed sequentially by the further steps of: forming an etch stop layer and an intermediate interconnection (S20), forming a capacitor (S30), forming an upper insulating layer (S40), forming a contact hole (S50), performing deuterium ($D_2$) annealing (S55), forming an upper plug (S60), forming an upper interconnection (S70), forming a passivation layer (S80), and performing $H_2$ annealing (S90). In this alternative method, performing the second deuterium annealing (S65 of FIG. 1) may be omitted.

Referring to FIG. 8, still another method of fabricating a semiconductor device according to the first exemplary embodiment may include a step of forming a transistor (S10), followed sequentially by the further steps of forming an etch stop layer and an intermediate interconnection (S20), forming a capacitor (S30), forming an upper insulating layer (S40), forming a contact hole (S50), forming an upper plug (S60), performing deuterium ($D_2$) annealing (S65), forming an upper interconnection (S70), forming a passivation layer (S80), and performing $H_2$ annealing (S90). In this alternative method, performing the first deuterium annealing (S55 of FIG. 1) may be omitted.

Figure 2:
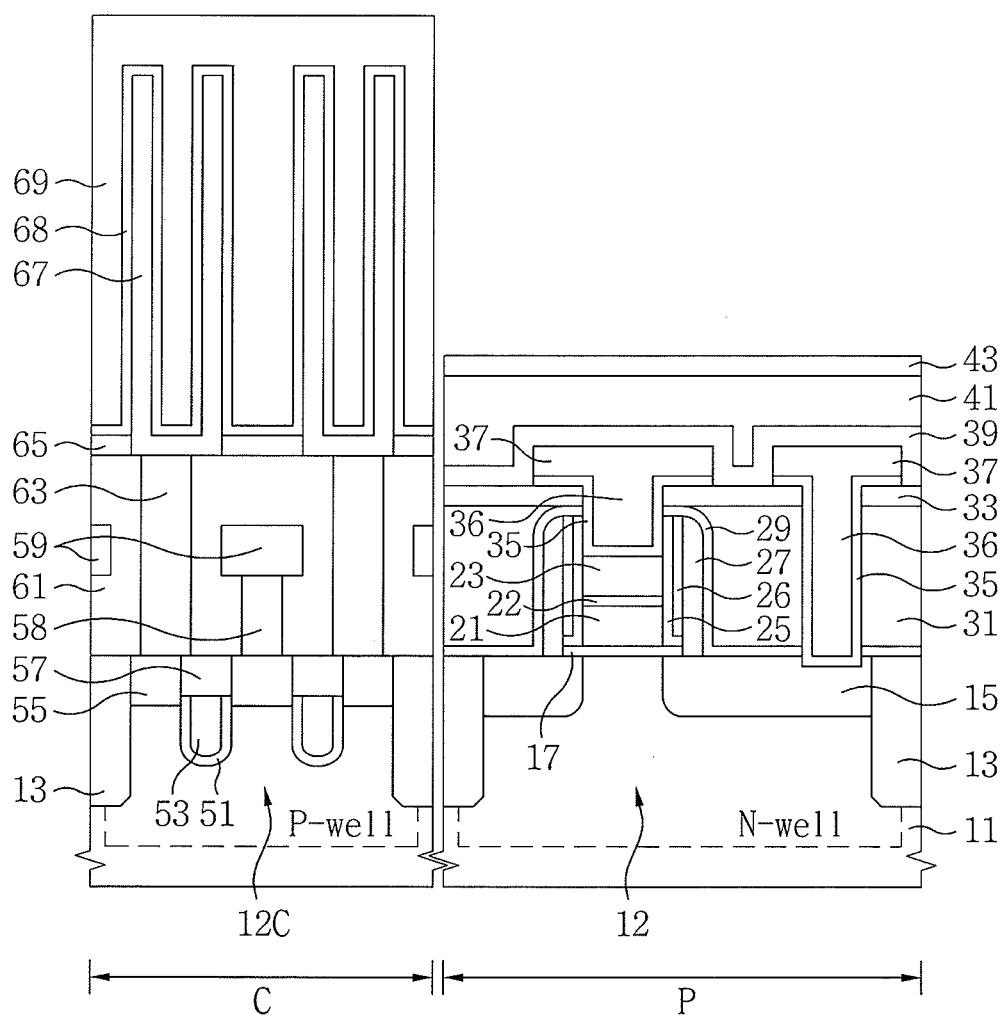
FIGS. 2, 3, 5 and 6 are schematic cross-sectional views illustrating steps in the methods of fabricating a semiconductor device according to the exemplary embodiment of the inventive concept shown in FIGS. 1,7 and 8.

Referring to FIGS. 1 and 2, transistors 12, 15, 17, 21, 22, and 23 may be formed on a semiconductor substrate 11 (corresponding to S10 in FIG. 1). Etch stop layers 29, 33, 39, 43, and 65 and intermediate interconnections 35, 36, and 37 may then be formed on the transistors 12, 15, 17, 21, 22, and 23 (S20). Capacitors 67, 68, and 69 may then be formed on the semiconductor substrate 11 adjacent to the transistors 12, 15, 17, 21, 22, and 23 (S30). For simplicity of the following descriptions, the method will be further described below with reference to a semiconductor substrate 11 that is a P-type silicon wafer. The transistors 12, 15, 17, 21, 22, and 23 may be PMOS transistors.

The semiconductor substrate 11 may include a cell region C and a peripheral region P. An isolation layer 13 defining active regions 12 and 12C may be formed in a predetermined region of the semiconductor substrate 11. The active regions 12 and 12C may be classified into a cell active region 12C and a peripheral active region 12. The cell active region 12C may be defined in a P-well of the cell region C, and the peripheral active region 12 may be defined in an N-well of the peripheral region P. In this case, the peripheral active region 12 may include an N-type silicon layer. Furthermore, the peripheral region P may further include a P-well and active/passive elements formed on the P-well, but the P-well and the active/passive elements will be omitted for simplicity of the descriptions. The isolation layer 13 may include a silicon oxide layer, a silicon nitride layer, a silicon oxynitride layer, or any combination thereof. The isolation layer 13 may be formed using a shallow trench isolation (STI) technique, as is known in this art.

The transistors 12, 15, 17, 21, 22, and 23 may be formed in the peripheral region P. The transistors 12, 15, 17, 21, 22, and 23 may include source/drain regions 15, a gate dielectric layer 17, a lower gate 21, a gate barrier layer 22, an upper gate 23, and the peripheral active region 12. The gate dielectric layer 17 may be formed on the peripheral active region 12. The lower gate 21, the gate barrier layer 22, and the upper gate 23 may be sequentially stacked on the peripheral active region 12. The lower gate 21, the gate barrier layer 22, and the upper gate 23 may constitute a gate electrode (21, 22, 23). In some embodiments, the gate barrier layer 22 or the upper gate 23 may be omitted. The gate dielectric layer 17 may be interposed between the peripheral active region 12 and the gate electrode (21, 22, 23). The source/drain regions 15 may be formed in the peripheral active region 12 adjacent to both sides of the gate electrode (21, 22, 23).

The gate dielectric layer 17 may include a silicon oxide layer, a silicon nitride layer, a silicon oxynitride layer, a high-K dielectric layer, or any combination thereof The lower gate 21 may include a polysilicon layer. The gate barrier layer 22 may include a titanium (Ti) layer, a TiN layer, a WN layer, a metal silicide layer, or any combination thereof The upper gate 23 may include a tungsten (W) layer, a WN layer, a Ti layer, a TiN layer, a metal silicide layer, a metal layer, or any combination thereof. The source/drain regions 15 may include a P-type silicon layer.

The source/drain regions 15, the gate dielectric layer 17, the gate electrode 21, 22, and 23, and the peripheral active region 12 may constitute a PMOS transistor. In some embodiments, an NMOS transistor may be further formed in the peripheral region P, however, these embodiments will be omitted here for simplicity of the descriptions.

Spacers 25, 26, and 27 may be formed on sidewalls of the gate electrode (21, 22, 23). The spacers 25, 26, and 27 may include a first inner spacer 25, a second inner spacer 26, and an outer spacer 27, respectively. The first inner spacer 25 may be interposed between the gate electrode (21, 22, 23) and the outer spacer 27. The first inner spacer 25 may be in contact with the sidewalls of the gate electrode (21, 22, 23). The second inner spacer 26 may be interposed between the first inner spacer 25 and the outer spacer 27.

Each of the spacers 25, 26, and 27 may include a silicon oxide layer, a silicon nitride layer, a silicon oxynitride layer, or any combination thereof. For example, the first inner spacer 25 may be a silicon nitride layer, the second inner spacer 26 may be a silicon oxide layer, and the outer spacer 27 may be a silicon oxide layer. In some embodiments, a re-oxidation layer (not shown) may be further formed between the first inner spacer 25 and the gate electrode (21, 22, 23), however, these embodiments will be omitted here for simplicity of the descriptions.

A first etch stop layer 29, a lower insulating layer 31, and a second etch stop layer 33 may be sequentially stacked on the semiconductor substrate 11 in the peripheral region P. The first etch stop layer 29 may cover the gate electrode (21, 22, 23), the spacers 25, 26, and 27, and the source/drain regions 15. An upper surface of the lower insulating layer 31 may be planarized. The first etch stop layer 29 may be a material layer having an etch selectivity with respect to the lower insulating layer 31. For example, the lower insulating layer 31 may be a silicon oxide layer, and the first etch stop layer 29 may be a nitride layer, such as a silicon nitride layer or a silicon oxynitride layer. The second etch stop layer 33 may be a material layer which is the same as that of the first etch stop layer 29. In another embodiment, the second etch stop layer 33 may be omitted. In still another embodiment, the second etch stop layer 33 may be a silicon oxide layer.

The intermediate interconnections 35, 36, and 37 may be a barrier metal layer 35, an intermediate plug 36, and a conductive line 37, respectively. The barrier metal layer 35 may cover a sidewall and bottom of the intermediate plug 36. One of the intermediate interconnections 35, 36, and 37 may be in contact with the gate electrode (21, 22, 23) through the second etch stop layer 33, the lower insulating layer 31 and the first etch stop layer 29. In this case, the intermediate plug 36 may be formed to pass through the second etch stop layer 33, the lower insulating layer 31 and the first etch stop layer 29, and the conductive line 37 may be formed on the second etch stop layer 33. The conductive line 37 may be in contact with the intermediate plug 36. Another one of the intermediate interconnections 35, 36, and 37 may be in contact with one of the source/drain regions 15 through the second etch stop layer 33, the lower insulating layer 31 and the first etch stop layer 29. In this case, the intermediate plug 36 may be formed to pass through the second etch stop layer 33, the lower insulating layer 31 and the first etch stop layer 29.

The barrier metal layer 35 may include a titanium (Ti) layer, a TiN layer, or any combination thereof. The intermediate plug 36 and the conductive line 37 may include a tungsten (W) layer, a WN layer, a Ti layer, a TiN layer, a metal silicide layer, a metal layer, or any combination thereof.

A third etch stop layer 39, an intermediate insulating layer 41, and a fourth etch stop layer 43 may be sequentially stacked on the intermediate interconnections 35, 36, and 37. The third etch stop layer 39 may cover the intermediate interconnections 35, 36, and 37 and the second etch stop layer 33. An upper surface of the intermediate insulating layer 41 may be planarized. The third etch stop layer 39 and the fourth etch stop layer 43 may be material layers having an etch selectivity with respect to the intermediate insulating layer 41. For example, the intermediate insulating layer 41 may be a silicon oxide layer, and each of the third etch stop layer 39 and the fourth etch stop layer 43 may be a nitride layer such as a silicon nitride layer or a silicon oxynitride layer.

Cell transistors 12C, 51, 53, and 55 may be formed in the cell region C of substrate 11 in FIG. 2. The cell transistors 12C, 51, 53, and 55 may include a cell gate dielectric layer 51, a cell gate electrode 53, cell source/drain regions 55, and the cell active region 12C, respectively. The cell active region 12C may include a P-type silicon layer, and the cell source/drain regions 55 may include N-type silicon layers. In this case, the cell transistors 12C, 51, 53, and 55 may be NMOS transistors. The cell gate electrode 53 may be formed at a lower level than an upper surface of the cell active region 12C. A capping layer 57 may be formed on the cell gate electrode 53.

The cell gate dielectric layer 51 may include a silicon oxide layer, a silicon nitride layer, a silicon oxynitride layer, a high-K dielectric layer, or any combination thereof. The cell gate electrode 53 may include a polysilicon layer, a tungsten (W) layer, a WN layer, a titanium (Ti) layer, a TiN layer, a metal silicide layer, a metal layer, or any combination thereof. The capping layer 57 may include an insulating layer such as a silicon oxide layer, a silicon nitride layer, a silicon oxynitride layer, or any combination thereof.

An interlayer insulating layer 61 may be formed on the cell region C. The interlayer insulating layer 61 may cover the cell transistors 12C, 51, 53, and 55. A bit plug 58, bit lines 59, and buried contact plugs 63 may be formed in the interlayer insulating layer 61. One of the bit lines 59 may be in electrical contact with one of the cell source/drain regions 55 through the bit plug 58. The buried contact plugs 63 may be in contact with the cell source/drain regions 55 through the interlayer insulating layer 61. A fifth etch stop layer 65 may be formed on the interlayer insulating layer 61. The fifth etch stop layer 65 may be formed together with the third etch stop layer 39 or the fourth etch stop layer 43.

The interlayer insulating layer 61 may include an insulating layer such as a silicon oxide layer, a silicon nitride layer, a silicon oxynitride layer, or any combination thereof. The bit plug 58, the bit lines 59, and the buried contact plugs 63 may include a polysilicon layer, a tungsten (W) layer, a WN layer, a titanium (Ti) layer, a TiN layer, a metal silicide layer, a metal layer, or any combination thereof. The fifth etch stop layer 65 may be a nitride layer such as a silicon nitride layer or a silicon oxynitride layer.

Storage nodes 67 in contact with the buried contact plugs 63 through the fifth etch stop layer 65 may be formed on the interlayer insulating layer 61. A capacitor dielectric layer 68 may be formed on the storage nodes 67. The capacitor dielectric layer 68 may be formed by a relatively high temperature process of about 450° C. to about 900° C. A plate electrode 69 may be formed on the capacitor dielectric layer 68. The storage nodes 67, the capacitor dielectric layer 68, and the plate electrode 69 may constitute the capacitors 67, 68, and 69. The capacitors 67, 68, and 69 may be in electrical contact with the cell transistors 12C, 51, 53, and 55 through the buried contact plugs 63. The cell transistors 12C, 51, 53, and 55 may serve as switching elements.

The storage nodes 67 and the plate electrode 69 may include a titanium (Ti) layer, a TiN layer, a TiAlN layer, a tantalum (Ta) layer, a TaN layer, a tungsten (W) layer, a WN layer, a polysilicon layer, a metal silicide layer, a metal layer, or any combination thereof. The capacitor dielectric layer 68 may include a silicon oxide layer, a silicon nitride layer, a silicon oxynitride layer, a high-K dielectric layer, or any combination thereof.

Figure 3:
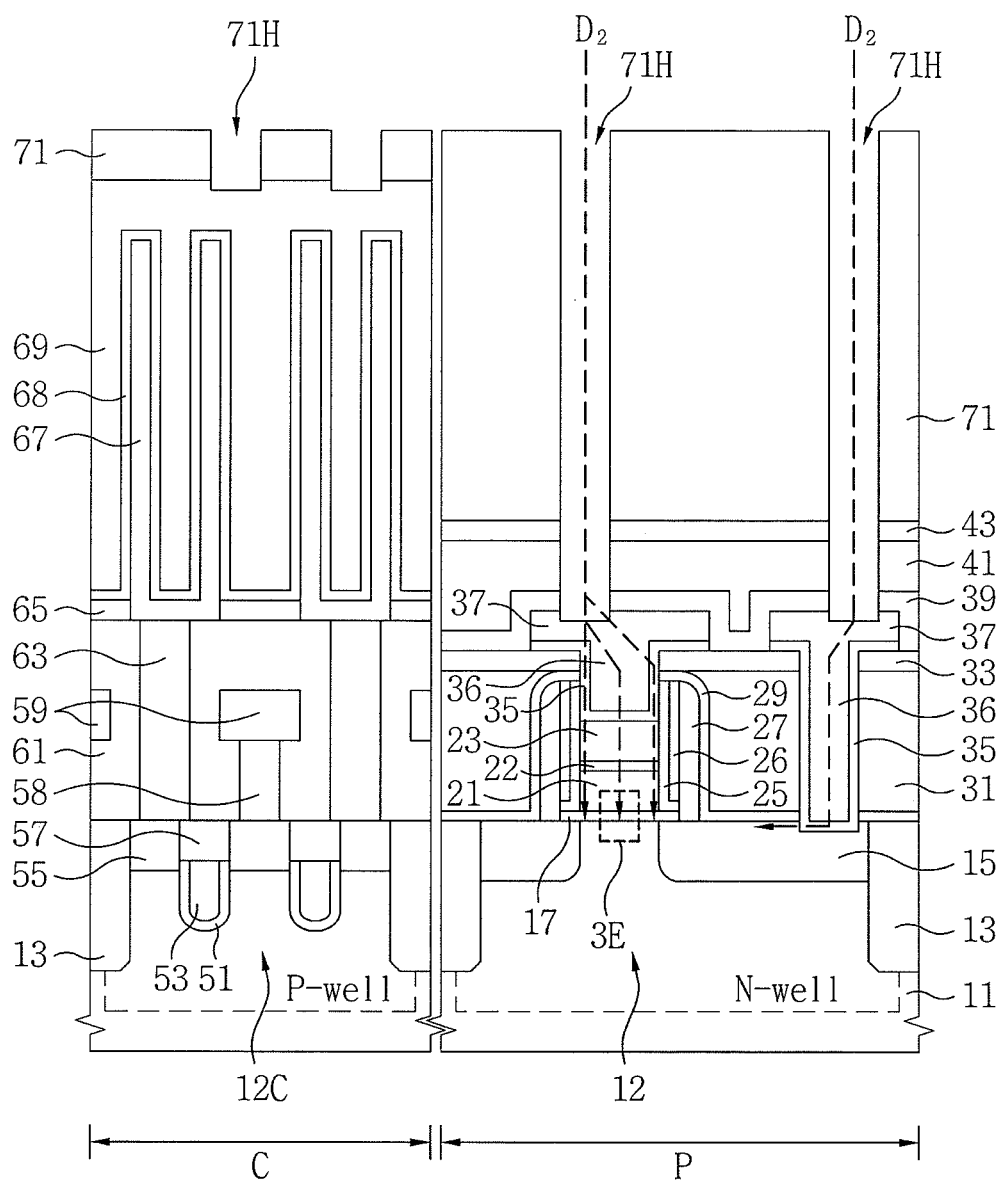
Figure 4:
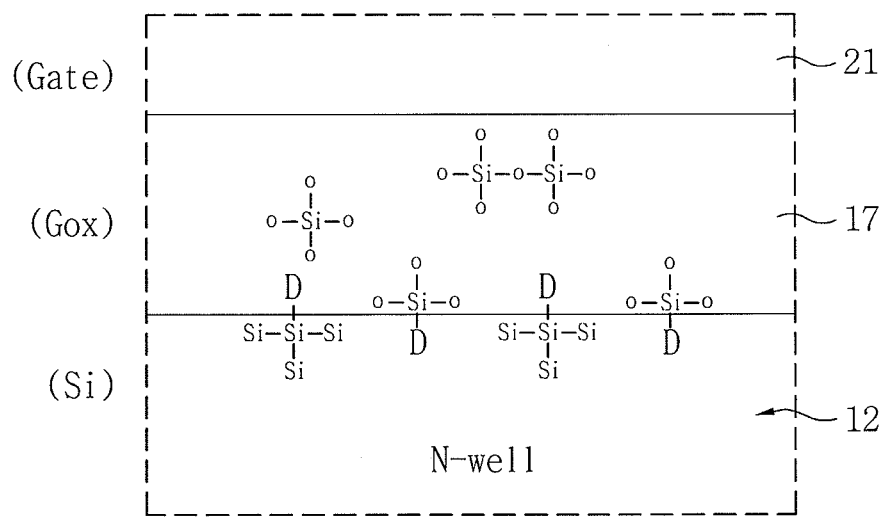
FIG. 4 is an enlarged view illustrating a part of FIG. 3 in greater detail.

Referring now to FIGS. 1 and 3, an upper insulating layer 71 may be formed on the semiconductor substrate 11 (corresponding to S40 in FIG. 1). Contact holes 71H passing through the upper insulating layer 71, the fourth etch stop layer 43, the intermediate insulating layer 41, and the third etch stop layer 39 may be formed (S50). Subsequently, a first deuterium annealing process may be performed (S55).

The upper insulating layer 71 may cover the fourth etch stop layer 43, and the upper insulating layer 71 may cover the plate electrode 69. The upper insulating layer 71 may include a silicon oxide layer, a silicon nitride layer, a silicon oxynitride layer, or any combination thereof. The upper insulating layer 71 may be a material layer having etch selectivity with respect to the fourth etch stop layer 43. For example, the upper insulating layer 71 may be a silicon oxide layer.

Some of the contact holes 71H may be formed on the intermediate interconnections 35, 36, and 37, and the other of the contact holes 71H may be formed on the plate electrode 69. The conductive line 37 in contact with the gate electrode (21, 22, 23) may be exposed to a bottom portion of one of the contact holes 71H. That is, one of the contact holes 71H may be adjacent to the gate electrode (21, 22, 23). In addition, another one of the contact holes 71H may be adjacent to an upper portion of the source and drain regions 15.

The first deuterium annealing process (S55) may include supplying deuterium on the semiconductor substrate 11 having the contact holes 71H at a temperature ranging from about 300° C. to about 700° C. In this case, the deuterium may be diffused into the gate dielectric layer 17 through one or more of the contact holes 71H. During the first deuterium annealing process, a diffusion path of the deuterium may include the insides of intermediate interconnections 35, 36 and 37 and the interfaces between the intermediate interconnections 35, 36, and 37 and the gate electrode (21, 22, 23).

For example, the diffusion path of the deuterium may go via the insides of the one or more contact holes 71H, the conductive line 37, the intermediate plug 36, the barrier metal layer 35, the upper gate 23, the gate barrier layer 22, and the lower gate 21. In addition, the diffusion path of the deuterium may go via the insides of the one or more contact holes 71H, an interface between the intermediate interconnections 35, 36, and 37 and the third etch stop layer 39, an interface between the intermediate interconnections 35, 36, and 37 and the second etch stop layer 33, an interconnection between the intermediate interconnections 35, 36, and 37 and the first etch stop layer 29, an interface between the intermediate interconnections 35, 36, and 37 and the spacers 25, 26, and 27, and an interface between the gate electrode (21, 22, 23) and the spacers 25, 26, and 27. Furthermore, the diffusion path of the deuterium may go via the one or more contact holes 71H, the intermediate interconnections 35, 36, and 37, an interface between the source/drain regions 15 and the first etch stop layer 29, and an interface between the source/drain regions 15 and the spacers 25, 26, and 27.

Referring to FIG. 4, a chemical coupling mechanism is schematically illustrated wherein deuterium diffused into the gate dielectric layer 17 may couple with a dangling bond located at an interface between the gate dielectric layer 17 and the peripheral active region 12. In particular, the deuterium may couple with a fixed oxide charge in the gate dielectric layer 17. As a result, the deuterium diffused into the gate dielectric layer 17 may serve to improve the negative bias temperature instability (NBTI) characteristic of the transistors 12, 15, 17, 21, 22, and 23.

According to the research conducted by the present inventors, hydrogen and the deuterium may exhibit an out-gassing phenomenon when exposed to a relatively high temperature of 450° C. or more. Particularly, hydrogen and deuterium exhibit a very active out-gassing phenomenon when exposed to a high temperature of about 650° C. or more. Further, the capacitor dielectric layer 68 may be formed by a relatively high temperature process carried out at about 450° C. to about 900° C. That is, a deuterium annealing technique performed before the process of forming the capacitor dielectric layer 68 may exhibit a relatively small beneficial effect because of the out-gassing phenomenon. However, according to the first exemplary embodiment of the inventive concept, the capacitors 67, 68, and 69 may be formed on the semiconductor substrate 11 adjacent to the transistors 12, 15, 17, 21, 22, and 23 (S30 in FIG. 1), before the first deuterium annealing process is performed (S55 in FIG. 1). That is, the beneficial coupling effect of the deuterium annealing may be maintained and maximized.

Meanwhile, according to other research conducted by the present inventors, there is experimental data suggesting that a silicon nitride layer may reduce or prevent the diffusion of the deuterium, and that a silicon oxide layer, a silicon layer, a tungsten (W) layer and a TiN layer have relatively excellent diffusion efficiency. According to the first exemplary embodiment of the inventive concept (as described above), the intermediate interconnections 35, 36, and 37 may be exposed through the contact holes 71H passing through the upper insulating layer 71, the fourth etch stop layer 43, the intermediate insulating layer 41, and the third etch stop layer 39. Accordingly, by practicing the inventive concept, during the first deuterium annealing process, the diffusion efficiency of the deuterium into the gate dielectric layer 17 may be maximized.

Referring now to FIGS. 1 and 5, upper plugs 73 may be formed in the contact holes 71 H (corresponding to S60 in FIG. 1). Subsequently, a second deuterium annealing process may be performed (S65).

The upper plugs 73 may be formed by a relatively low temperature process of about 400° C. or less to reduce or prevent the out-gassing of the deuterium. The upper plugs 73 may include a metal layer such as a tungsten (W) layer or a ruthenium (Ru) layer. The upper plugs 73 may be formed by a thin film forming process and a planarizing process. The planarizing process may include a chemical mechanical polishing (CMP) process, an etch-back process, or a combination thereof. As a result, upper surfaces of the upper plugs 73 and the upper insulating layer 71 may be exposed.

The second deuterium annealing process may include a step of supplying deuterium on the semiconductor substrate 11 having the upper plugs 73 at a temperature ranging from about 300° C. to about 700° C. In this case, the deuterium may be diffused into the gate dielectric layer 17 through the upper plugs 73 and the contact holes 71 H.

Referring now to FIGS. 1 and 6, upper interconnections 75 may be formed on the upper plugs 73 (corresponding to S70 in FIG. 1). A passivation layer 77 covering the upper interconnections 75 may be formed on the upper insulating layer 71 (S80). Subsequently, $H_2$ annealing may be performed (S90).

The upper interconnections 75 and the passivation layer 77 may be formed by a relatively low temperature process of about 400° C. or less to reduce or prevent the out-gassing of the deuterium. The upper interconnections 75 may include a metal layer such as a tungsten (W) layer, a rutherium (Ru) layer, a titanium (Ti) layer, a TiN layer, a copper (Cu) layer, an aluminum (Al) layer, a cobalt (Co) layer, a nickel (Ni) layer, or any combination thereof. The passivation layer 77 may include a silicon oxide layer, a silicon nitride layer, a silicon oxynitride layer, a low-K dielectric layer, or any combination thereof. For example, the passivation layer 77 may be formed by sequentially stacking a silicon oxide layer using a high density plasma (HDP) method and a silicon nitride layer using a plasma enhanced chemical vapor deposition (PECVD) layer.

[Exemplary Embodiment 2]

Figure 9:
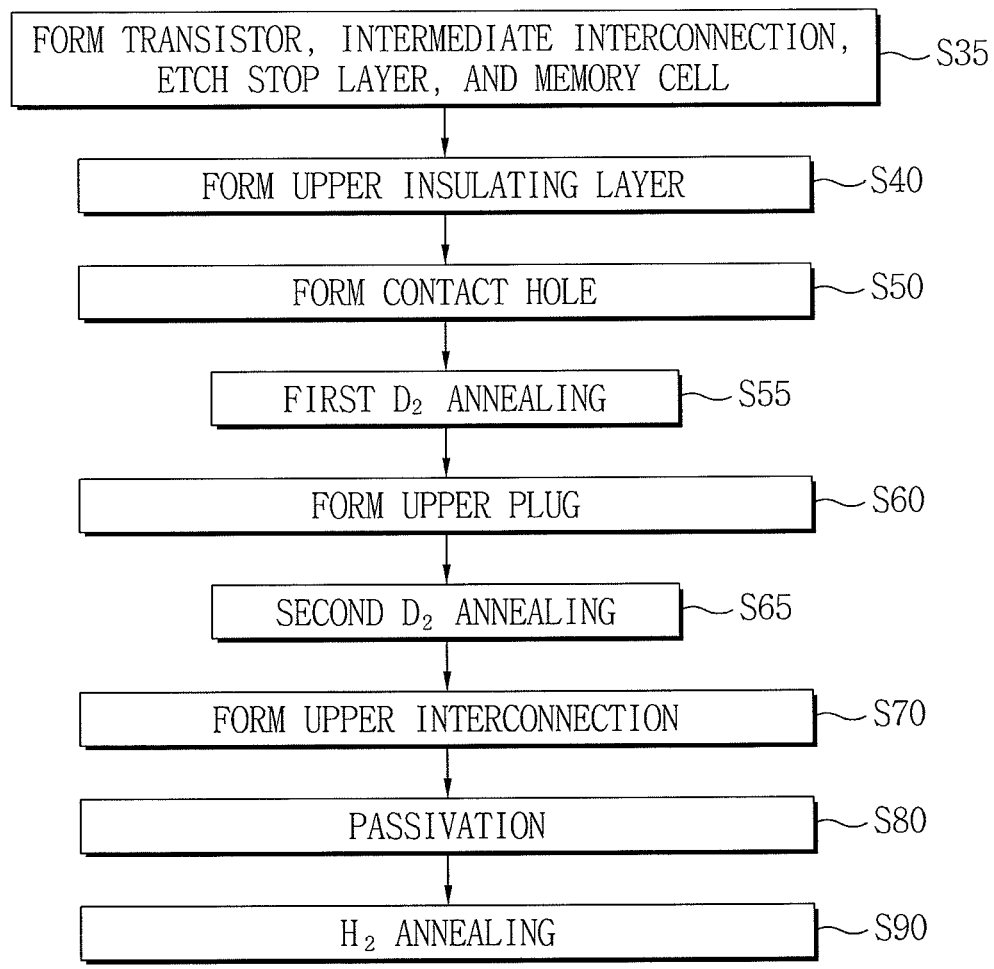
FIG. 9 is a process flowchart illustrating methods of fabricating a semiconductor device according to a second exemplary embodiment of the inventive concept.
Figure 10:
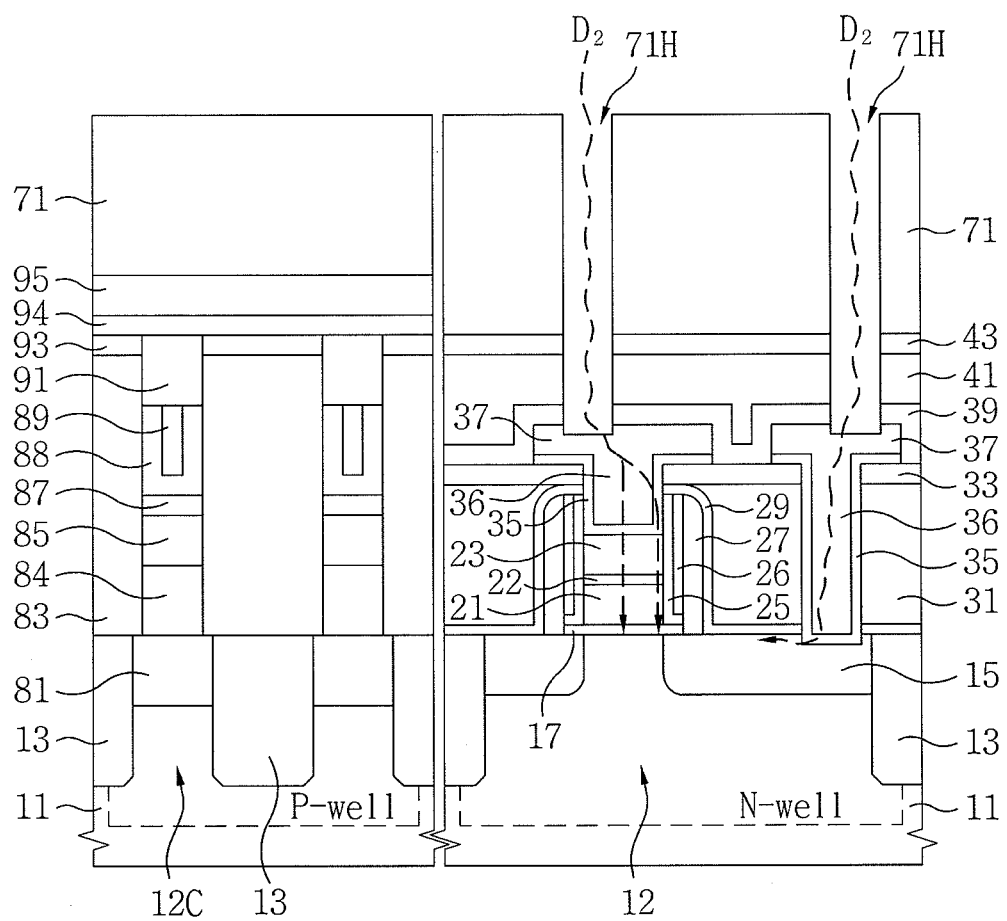
FIGS. 10 to 12 are schematic cross-sectional views illustrating steps in the method of fabricating a semiconductor device according to the exemplary embodiment of the inventive concept shown in FIG. 9.
Figure 11:
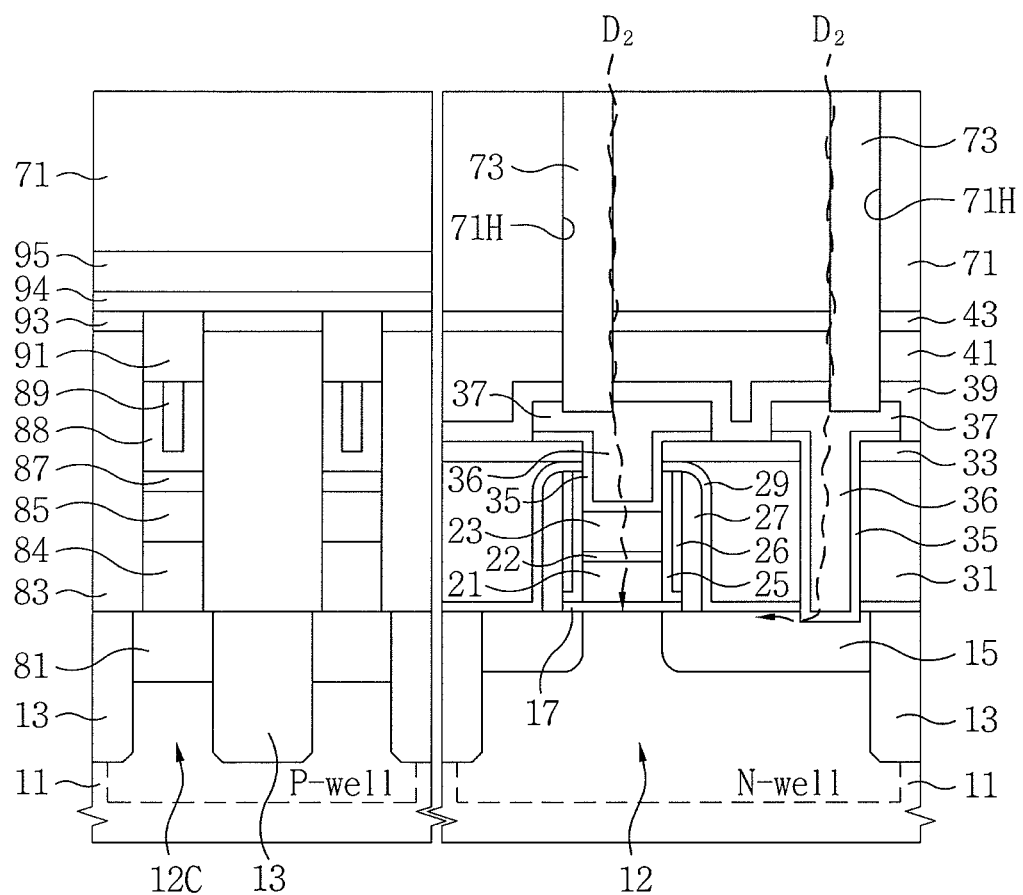
Figure 12:
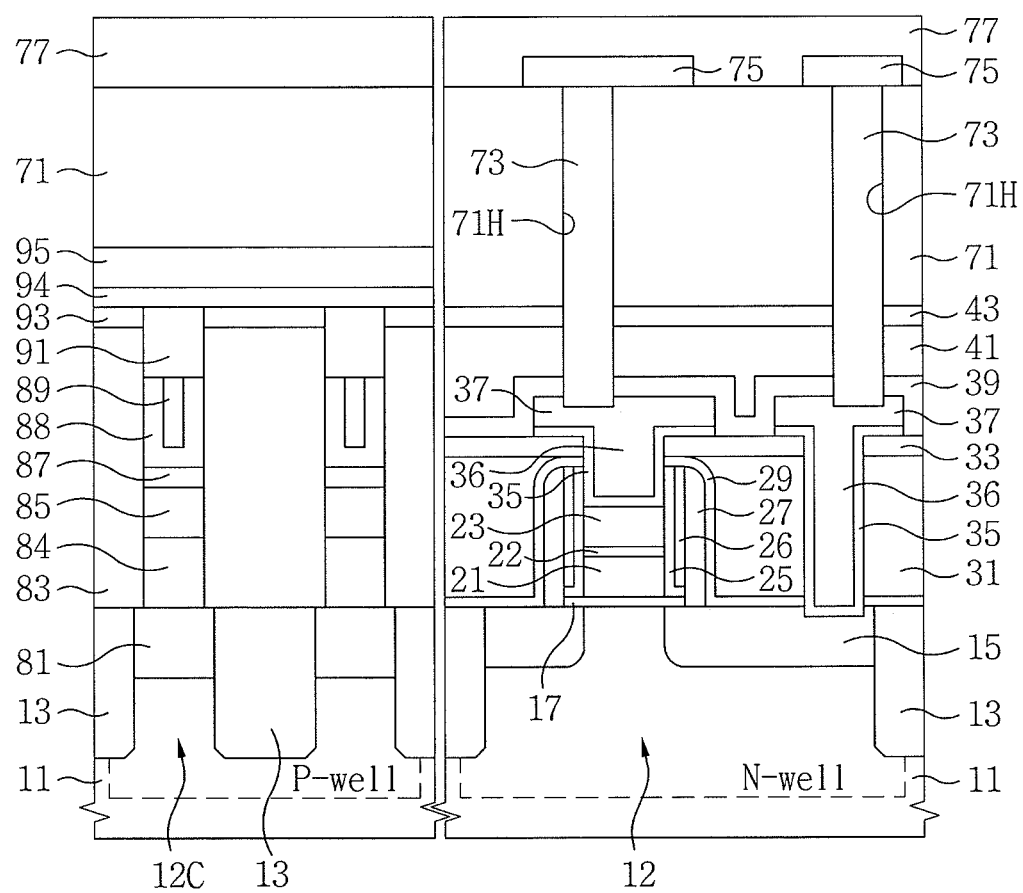

FIG. 9 is a process flowchart illustrating methods of fabricating a semiconductor device according to a second exemplary embodiment of the inventive concept, and FIGS. 10 to 12 are schematic cross-sectional views illustrating steps in the method of fabricating a semiconductor device according to the second exemplary embodiment of the inventive concept. The semiconductor device according to this exemplary embodiment may be a non-volatile memory device such as a phase change memory.

Referring to FIG. 9, the method of fabricating a semiconductor device according to the second exemplary embodiment may include steps of forming a transistor, an intermediate interconnection, an etch stop layer, and a memory cell (S35), followed sequentially by the further steps of: forming an upper insulating layer (S40), forming a contact hole (S50), performing a first deuterium annealing (S55), forming an upper plug (S60), performing a second deuterium annealing (S65), forming an upper interconnection (S70), forming a passivation layer (S80), and performing $H_2$ annealing (S90).

Referring now to FIGS. 9 and 10, transistors 12, 15, 17, 21, 22, and 23, etch stop layers 29, 33, 39, 43, and 93, intermediate interconnections 35, 36, and 37, and memory cells 81, 84, 85, 87, 88, 89, 91, 94, and 95 may be formed on a semiconductor substrate 11 (corresponding to S35 in FIG. 9). An upper insulating layer 71 may then be formed on the etch stop layers 29, 33, 39, 43, and 93 and the memory cells 81, 84, 85, 87, 88, 89, 91, 94, and 95 (S40). Contact holes 71H may then be formed (S50). Subsequently, the first deuterium annealing process may be performed (S55).

An isolation layer 13 defining active regions 12 and 12C may be formed in a predetermined region of the semiconductor substrate 11. The active regions 12 and 12C may be classifed into a cell active region 12C and a peripheral active region 12. The transistors 12, 15, 17, 21, 22, and 23 may include source/drain regions 15, a gate dielectric layer 17, a lower gate 21, a gate barrier layer 22, an upper gate 23, and the peripheral active region 12. The lower gate 21, the gate barrier layer 22, and the upper gate 23 may constitute a gate electrode (21, 22, 23).

Spacers 25, 26, and 27 may be formed on sidewalls of the gate electrode (21, 22, 23). The spacers 25, 26, and 27 may include a first inner spacer 25, a second inner spacer 26, and an outer spacer 27. A first etch stop layer 29, a lower insulating layer 31, and a second etch stop layer 33 may be sequentially stacked on the semiconductor substrate 11. The intermediate interconnections 35, 36, and 37 may include a barrier metal layer 35, an intermediate plug 36, and a conductive line 37. A third etch stop layer 39, an intermediate insulating layer 41, and a fourth etch stop layer 43 may be sequentially stacked on the intermediate interconnections 35, 36, and 37.

Word lines 81 may be formed in the cell active region 12C. An interlayer insulating layer 83 and a fifth etch stop layer 93 may be sequentially stacked on the word lines 81 and the isolation layer 13. Diodes 84 and 85 and diode electrodes 87 may be formed in the interlayer insulating layer 83. The diodes 84 and 85 may include a first pattern 84 and a second pattern 85 on the first pattern 84. Lower electrodes 88 and core patterns 89 may be formed on the diode electrodes 87. Phase change patterns 91 may be formed on the lower electrodes 88.

The diodes 84 and 85, the diode electrodes 87, the lower electrodes 88, the core patterns 89, and the phase change patterns 91 may be confined in memory holes passing through the fifth etch stop layer 93 and the interlayer insulating layer 83. An upper electrode 94 and a bit line 95 may be formed on the phase change patterns 91. The diodes 84 and 85 may serve as switching elements. In some embodiments, the diodes 84 and 85 may be replaced with cell transistors or omitted.

The upper insulating layer 71 may cover the fourth etch stop layer 43, and the upper insulating layer 71 may cover the bit line 95. The first deuterium annealing process may include a step of supplying deuterium on the semiconductor substrate 11 having the contact holes 71H at a temperature ranging from about 300° C. to about 700° C. In this case, the deuterium may be diffused into the gate dielectric layer 17 through the contact holes 71H.

Referring now to FIGS. 9, 11, and 12, upper plugs 73 may be formed in the contact holes 71H (corresponding to S60 in FIG. 9). Subsequently, a second deuterium annealing may be performed (S65). Upper interconnections 75 may be formed on the upper plugs 73 (S70). A passivation layer 77 covering the upper interconnections 75 may be formed on the upper insulating layer 71 (S80). Subsequently, $H_2$ annealing may be performed (S90).

In some embodiments, the memory cells 81, 84, 85, 87, 88, 89, 91, 94, and 95 may include a capacitor dielectric layer, a cell transistor, a photo diode, a charge trap layer, a ferroelectric layer, a magnetic tunnel junction device, a transition metal oxide layer, or a combination thereof. The memory cells 81, 84, 85, 87, 88, 89, 91, 94, and 95 may be formed by a relatively high temperature process of about 450° C. to about 900° C.

[Exemplary Embodiment 3]

Figure 13:
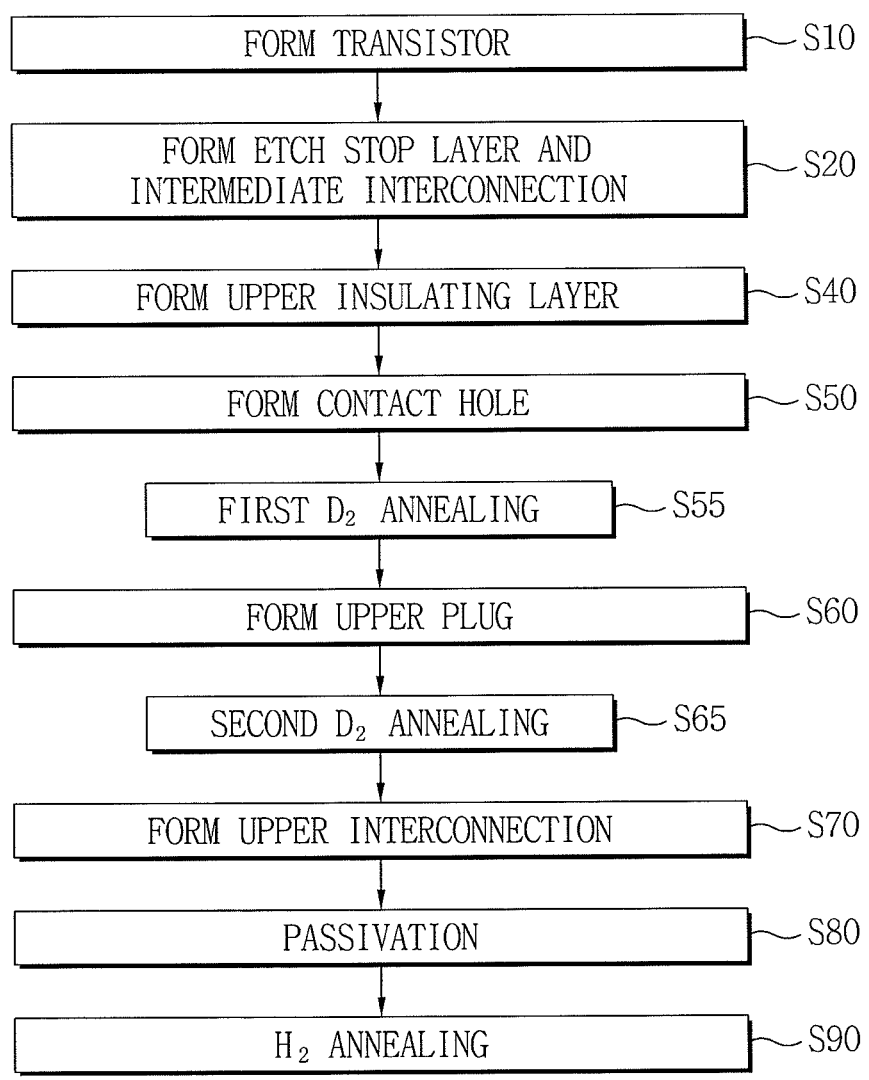
FIG. 13 is a process flowchart illustrating methods of fabricating a semiconductor device according to a third exemplary embodiment of the inventive concept.

FIG. 13 is a process flowchart illustrating methods of fabricating a semiconductor device according to a third exemplary embodiment of the inventive concept, and FIGS. 14 to 18 are schematic cross-sectional views illustrating steps in the method of fabricating a semiconductor device according to the third exemplary embodiment of the inventive concept.

Referring to FIG. 13, the method of fabricating a semiconductor device according to the third exemplary embodiment may include a step of forming a transistor (S10), followed sequentially by the further steps of: forming an etch stop layer and an intermediate interconnection (S20), forming an upper insulating layer (S40), forming a contact hole (S50), performing a first deuterium annealing (S55), forming an upper plug (S60), performing a second deuterium annealing (S65), forming an upper interconnection (S70), forming a passivation layer (S80), and performing $H_2$ annealing (S90).

Figure 14:
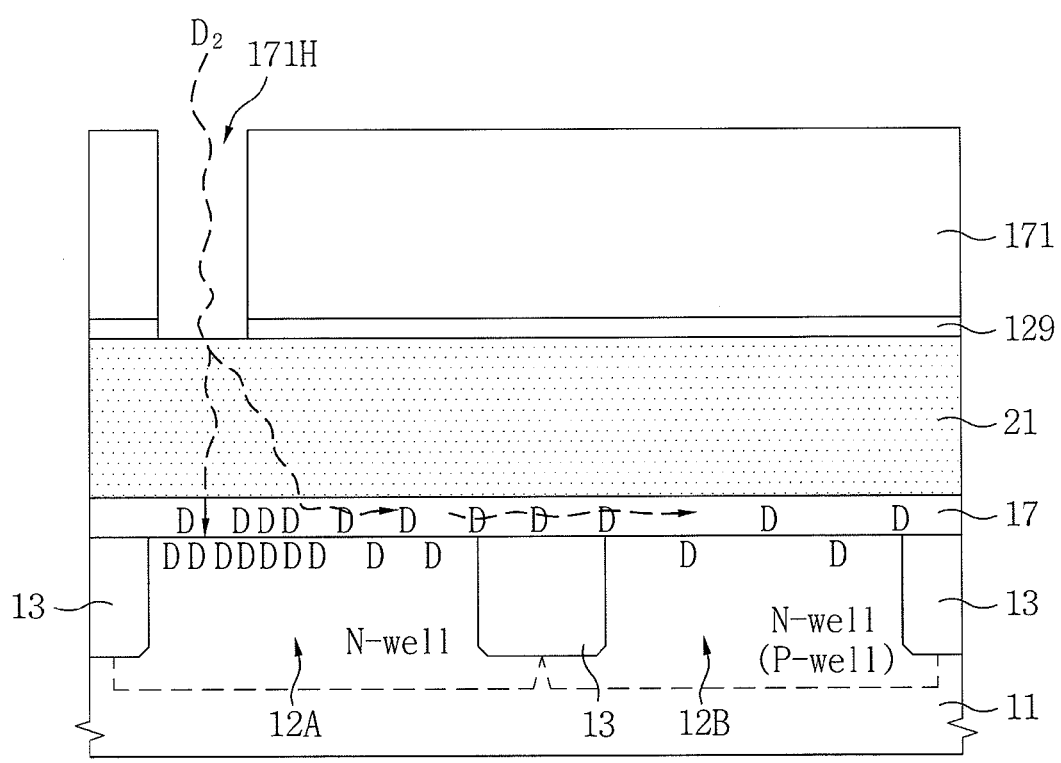
FIGS. 14 to 18 are schematic cross-sectional views illustrating the method of fabricating a semiconductor device according to the exemplary embodiment of the inventive concept shown in FIG. 13.

Referring now to FIGS. 13 and 14, transistors 12A, 12B, 17, and 21 may be formed on a semiconductor substrate 11 (corresponding to S10 in FIG. 13). An etch stop layer 129 may then be formed on the transistors 12A, 12B, 17, and 21 (S20). An upper insulating layer 171 may then be formed on the etch stop layer 129 (S40). A contact hole 171H passing through the upper insulating layer 171 and the etch stop layer 129 may then be formed (S50). Subsequently, a first deuterium annealing process may be performed (S55).

An isolation layer 13 defining a first active region 12A and a second active region 12B may be formed in the semiconductor substrate 11. A gate dielectric layer 17 may be formed on the first active region 12A and the second active region 12B. A gate electrode 21 may be formed on the gate dielectric layer 17. The etch stop layer 129 may cover the gate electrode 21. The etch stop layer 129 may include a nitride layer such as a silicon nitride layer and a silicon oxynitride layer. The upper insulating layer 171 may include a silicon oxide layer.

Before the first deuterium annealing process, active/passive elements may be formed on the semiconductor substrate 11, but this embodiment is omitted here for simplicity of the descriptions. The active/passive elements may include a capacitor dielectric layer, a cell transistor, a diode, a photo diode, a charge trap layer, a phase change material layer, a ferroelectric layer, a magnetic tunnel junction device, a transition metal oxide layer, or any combination thereof. The active/passive elements may be formed by a relatively high temperature process of about 450° C. to about 900° C.

The first deuterium annealing process may include a step of supplying deuterium on the semiconductor substrate 11 having the contact hole 171H at a temperature ranging from about 300° C. to about 700° C. In this case, the deuterium may be diffused into the gate dielectric layer 17 through the contact hole 171H.

The first active region 12A, the gate dielectric layer 17, and the gate electrode 21 may constitute a first transistor (12A, 17, 21), and the second active region 12B, the gate dielectric layer 17, and the gate electrode 21 may constitute a second transistor (12B, 17, 21).

Both of the first active region 12A and the second active region 12B may be defined in an N-well. In this case, the first and second active regions 12A and 12B may be N-type active regions, and the first and second transistors 12A, 12B, 17, and 21 may be PMOS transistors.

As described above with reference to FIG. 4, the deuterium diffused into the gate dielectric layer 17 may couple with a dangling bond located at an interface between the gate dielectric layer 17 and the active regions 12A and 12B, and the deuterium may couple with a fixed oxide charge in the gate dielectric layer 17. As a result, the deuterium diffused into the gate dielectric layer 17 may serve to improve the negative bias temperature instability (NBTI) characteristics of the first and second transistors, (12A, 17, 21) and (12B, 17, 21) respectively.

As shown in FIG. 14, the contact hole 171H may be disposed relatively close to the first active region 12A, and disposed relatively apart from the second active region 12B. That is, the contact hole 171H may be disposed relatively close to the first transistor (12A, 17, 21), and disposed relatively apart from the second transistor (12B, 17, 21). Accordingly, the content of the deuterium in the gate dielectric layer 17 may be relatively high in the portion of gate dielectric layer 17 that is disposed closer to the contact hole 171H, and may be relatively lower in the portion of the gate dielectric layer 17 that is disposed further apart from the contact hole 171H. This variation in deuterium content in different portions of layer 17 is schematically illustrated in FIG. 14 by the greater or lesser concentrations of the letter "D" in layer 17.

In some exemplary embodiments, the first active region 12A may be defined in an N-well, and the second active region 12B may be defined in a P-well. In this case, the first active region 12A may be an N-type active region, the first transistor (12A, 17, 21) may be a PMOS transistor, the second active region 12B may be a P-type active region, and the second transistor (12B, 17, 21) may be an NMOS transistor.

Figure 15:
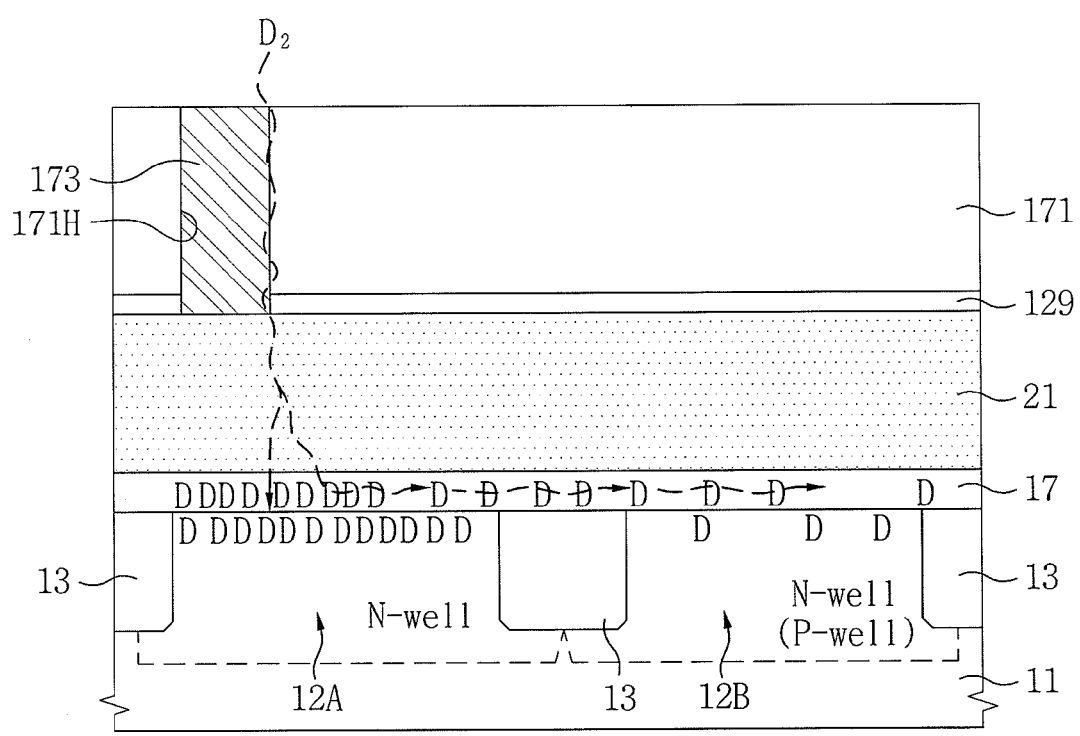
Figure 16:
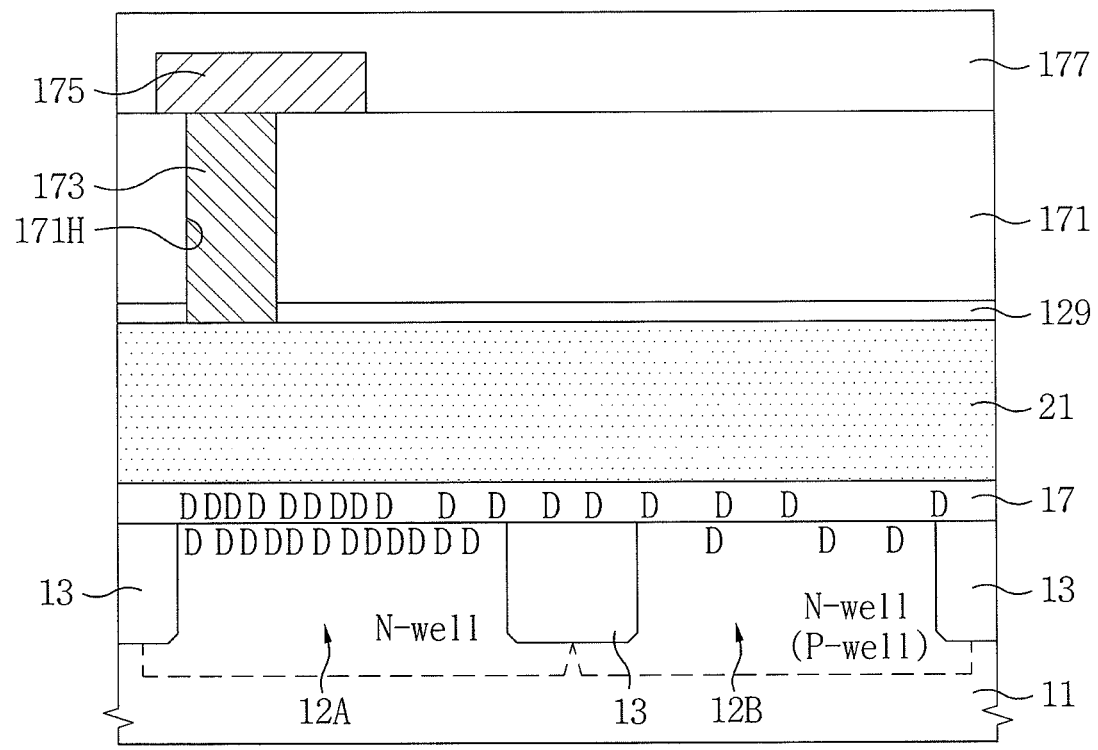

Referring now to FIGS. 13, 15, and 16, an upper plug 173 may be formed in the contact hole 171H (corresponding to S60 in FIG. 13). Subsequently, a second deuterium annealing may be performed (S65). An upper interconnection 175 may then be formed on the upper plug 173 (S70). A passivation layer 177 covering the upper interconnection 175 may then be formed on the upper insulating layer 171 (S80). Subsequently, $H_2$ annealing may be performed (S90).

Figure 17:
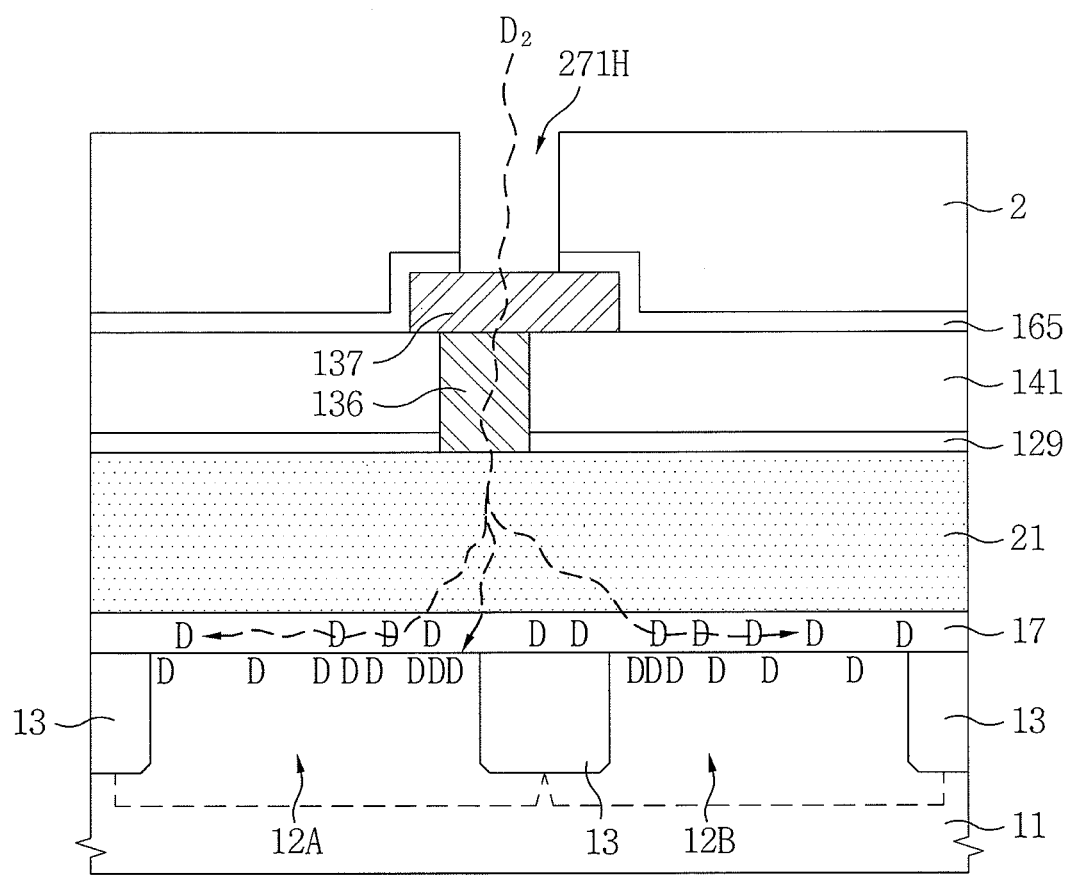

Referring now to FIGS. 13 and 17, transistors 12A, 12B, 17, and 21 may be formed on a semiconductor substrate 11 (corresponding to S10 in FIG. 13). Etch stop layers 129 and 165 and intermediate interconnections 136 and 137 may then be formed on the transistors (12A, 17, 21) and (12B, 17, 21) (S20). An upper insulating layer 271 may then be formed on the etch stop layers 129 and 165 (S40). A contact hole 271H may then be formed (S50). Subsequently, a first deuterium annealing process may be performed (S55).

An isolation layer 13 defining a first active region 12A and a second active region 12B may be formed in the semiconductor substrate 11. A gate dielectric layer 17 may be formed on the first active region 12A and the second active region 12B. A gate electrode 21 may be formed on the gate dielectric layer 17. A first etch stop layer 129 may be formed on the gate electrode 21. An intermediate insulating layer 141 may be formed on the first etch stop layer 129. The intermediate interconnections 136 and 137 may include an intermediate plug 136 and a conductive line 137. The intermediate plug 136 in contact with the gate electrode 21 may be formed through the intermediate insulating layer 141 and the first etch stop layer 129. The conductive line 137 may be formed on the intermediate plug 136. A second etch stop layer 165 covering the conductive line 137 may be formed on the intermediate insulating layer 141. The upper insulating layer 271 may be formed on the second etch stop layer 165.

The first etch stop layer 129 and the second etch stop layer 165 may include a nitride layer such as a silicon nitride layer and a silicon oxynitride layer. The upper insulating layer 271 may include a silicon oxide layer.

The contact hole 271H exposing the conductive line 137 may be formed through the upper insulating layer 271 and the second etch stop layer 165. The contact hole 271H may be aligned between the first active region 12A and the second active region 12B. The first deuterium annealing process may include a step of supplying deuterium on the semiconductor substrate 11 at a temperature ranging from about 300° C. to about 700° C. In this case, the deuterium may be diffused into the gate dielectric layer 17 through the contact hole 271H.

Figure 18:
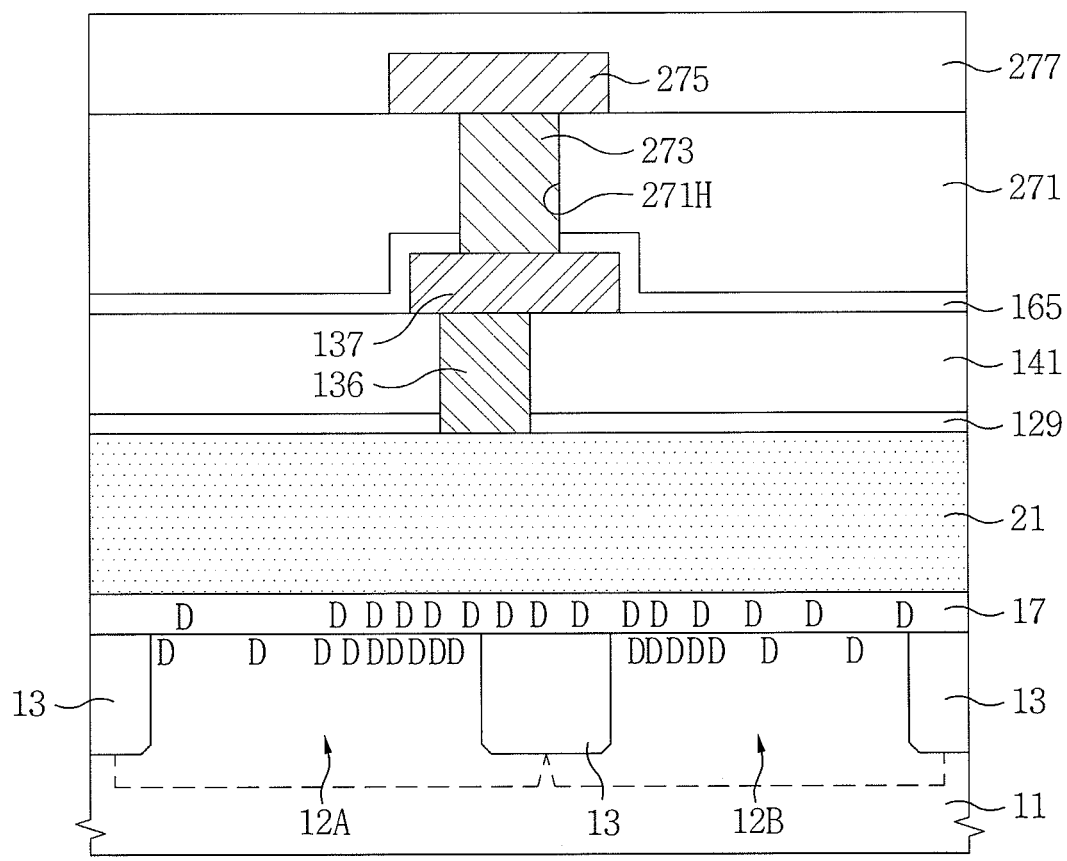

Referring now to FIGS. 13 and 18, an upper plug 273 may be formed in the contact hole 271H (corresponding to S60 in FIG. 13). Subsequently, a second deuterium annealing process may be performed (S65). An upper interconnection 275 may be formed on the upper plug 273 (S70). A passivation layer 277 covering the upper interconnection 275 may be formed on the upper insulating layer 271 (S80). Subsequently, $H_2$ annealing may be performed (S90).

EXPERIMENTAL EXAMPLE

Figure 19:
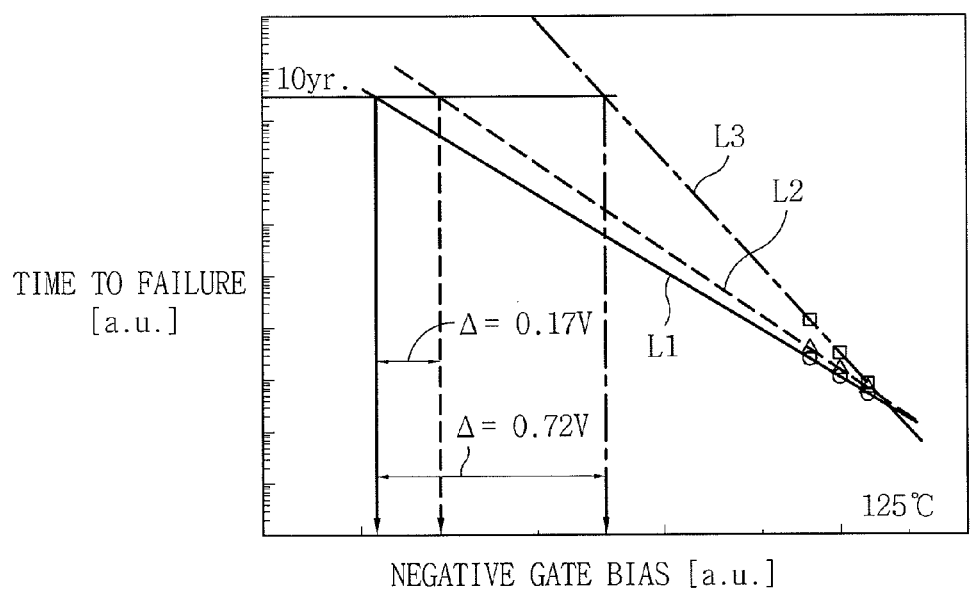
FIG. 19 is a diagram showing the negative bias temperature instability (NBTI) characteristics according to an experimental example of the inventive concept.

FIG. 19 is a diagram showing the negative bias temperature instability (NBTI) characteristics according to an experimental example of the inventive concept. A horizontal axis of FIG. 19 indicates a negative gate bias measured in arbitrary units (a. u.). A vertical axis of FIG. 19 indicates a time to failure measured in years. The temperature applied for the NBTI test used in the experimental example is 125° C.

Referring to FIG. 19, a first correlation line L1 illustrates NBTI characteristics measured from samples that do not undergo a deuterium annealing process (i.e., samples that are not prepared according to this inventive concept). A second correlation line L2 illustrates NBTI characteristics measured from samples that undergo a deuterium annealing process for 15 minutes at a temperature of 475° C. after forming an upper plug (according to an embodiment). A third correlation line L3 illustrates NBTI characteristics measured from samples that undergo a first deuterium annealing process for 15 minutes at a temperature of 475° C. after forming a contact hole, and a second deuterium annealing process for 15 minutes at a temperature of 475° C. after forming an upper plug as shown in FIG. 1 (also according to an embodiment).

As seen in FIG. 19, based on a time to failure of 10 years, there is a difference of NBTI values between the first and second correlation lines L1 and L2 of 0.17 V, and a difference of NBTI values between the first and third correlation lines L1 and L3 of 0.72 V. As a result, as shown with the second and third correlation lines L2 and L3, the NBTI characteristics of semiconductor devices can be remarkably and unexpectedly improved by using a deuterium annealing process according to the present inventive concepts.

[Exemplary Embodiment 4]

Figure 20:
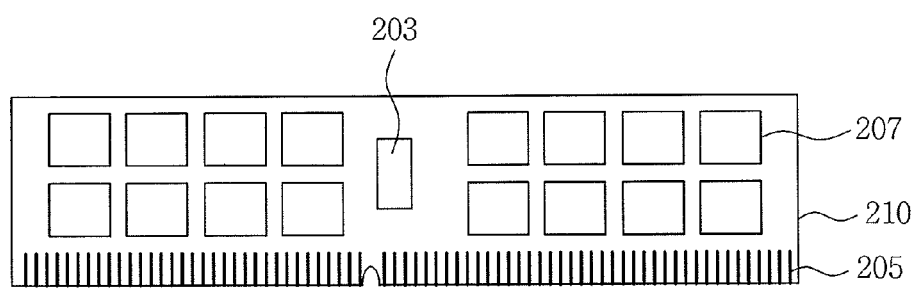
FIG. 20 is a schematic layout of a semiconductor module according to a fourth exemplary embodiment of the inventive concept.

FIG. 20 is a layout of a semiconductor module according to a fourth exemplary embodiment of the inventive concept.

Referring to FIG. 20, the semiconductor module according to the fourth exemplary embodiment may include a module substrate 210, a plurality of semiconductor packages 207, and a control chip package 203. Input/output terminals 205 may be formed in the module substrate 210. At least one of the semiconductor packages 207 and the control chip package 203 may be formed by a method of fabricating a semiconductor device according to the present inventive concepts and similar to that described above with reference to FIGS. 1 to 18. For example, the transistors (12, 15, 17, 21, 22, and 23 of FIG. 2) may be formed in the semiconductor packages 207 and/or the control chip package 203, and the upper interconnections (75 of FIG. 6) may be in electrical contact with the input/output terminals 205 via a bond finger formed in the module substrate 210.

The semiconductor packages 207 and the control chip package 203 may be mounted on the module substrate 210. The semiconductor packages 207 and the control chip package 203 may be electrically connected in series/parallel with the input/output terminals 205.

In alternative embodiments, the control chip package 203 may be omitted. The semiconductor packages 207 may include a volatile memory chip, such as a dynamic random access memory (DRAM) or a static random access memory (SRAM), a non-volatile memory chip, such as a flash memory, a phase change memory, a magnetic random access memory (MRAM), or a resistive random access memory (RRAM); or a combination thereof. In this case, the semiconductor module according to the fourth exemplary embodiment of the inventive concept may be a memory module.

[Exemplary Embodiment 5]

Figure 21:
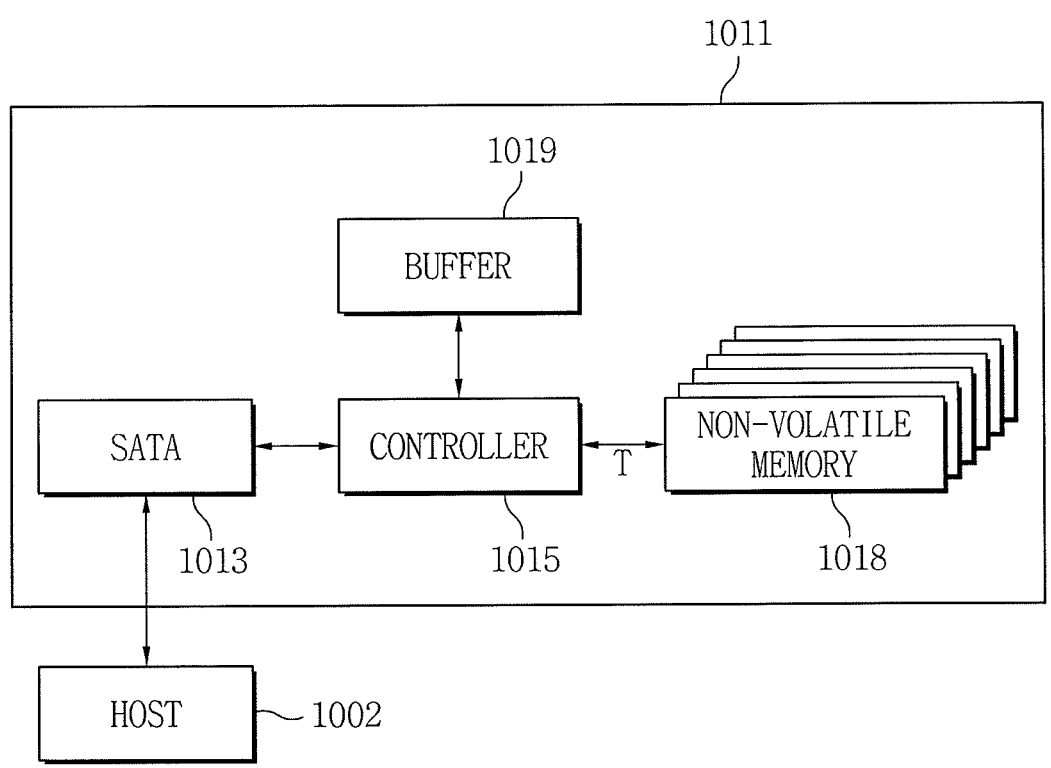
FIG. 21 is a system block diagram of an electronic device according to a fifth exemplary embodiment of the inventive concept.

FIG. 21 is a system block diagram of an electronic device according to a fifth exemplary embodiment of the inventive concept. The electronic device may be a data storage device such as a solid state disk (SSD) 1011.

Referring to FIG. 21, the SSD 1011 may include an interface 1013, a controller 1015, a non-volatile memory 1018, and a buffer memory 1019. At least one of the controller 1015, the non-volatile memory 1018, and the buffer memory 1019 may be formed by a method of fabricating a semiconductor device according to the present inventive concepts and similar to that described above with reference to FIGS. 1 to 18. For example, the buffer memory 1019 may include a semiconductor device having a configuration similar to FIG. 6.

The SSD 1011 is a device storing data using a semiconductor device. The SSD 1011 may have higher speed, and lower mechanical delay, failure rate, heat and noise, and be lightweight and compact in size compared to a hard disk drive (HDD). Thus, the SSD 1011 may be used in notebook PCs, desktop PCs, MP3 players, or portable storage devices.

The controller 1015 may be formed adjacent and electrically connected to the interface 1013. The controller 1015 may be a microprocessor including a memory controller and a buffer controller. The non-volatile memory 1018 may be formed adjacent and electrically connected to the controller 1015. Data storage capacity of the SSD 1011 may correspond to the non-volatile memory 1018. The buffer memory 1019 may be formed adjacent and electrically connected to the controller 1015.

The interface 1013 may be connected to a host 1002, and serve to send and receive electrical signals such as data. For example, the interface 1013 may be a device using a specification such as serial advanced technology attachment (SATA), integrated drive electronics (IDE), small computer system interface (SCSI), and/or a combination thereof. The non-volatile memory 1018 may be connected to the interface 1013 via the controller 1015. The non-volatile memory 1018 may serve to store data received from the interface 1013. Although power supply to the SSD 1011 may be periodically interrupted, the data stored in the non-volatile memory 1018 may be retained.

The buffer memory 1019 may include a volatile memory. The volatile memory may be a DRAM and/or a SRAM. The buffer memory 1019 may exhibit a relatively faster operating speed than the non-volatile memory 1018.

The data processing speed of the interface 1013 may be relatively faster than the operating speed of the non-volatile memory 1018. Here, the buffer memory 1019 may serve to temporarily store data. The data received through the interface 1013 may be temporarily stored in the buffer memory 1019 via the controller 1015, and permanently stored in the non-volatile memory 1018 at a data write speed of the non-volatile memory 1018. Frequently used data of the data stored in the non-volatile memory 1018 may be previously read and then temporarily stored in the buffer memory 1019. In other words, the buffer memory 1019 may serve to increase an effective operating speed of the SSD 1011 and to reduce an error rate.

[Exemplary Embodiment 6]

Figure 22:
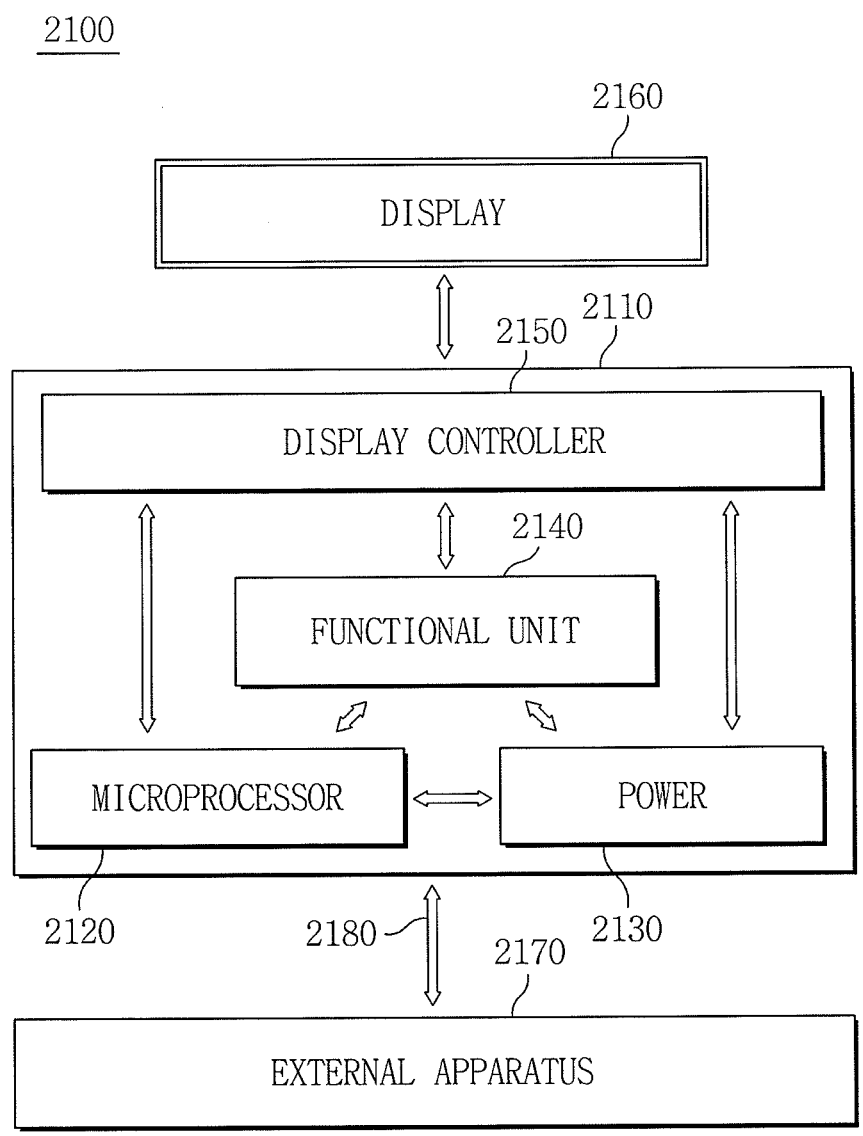
FIG. 22 is a system block diagram of an electronic device according to a sixth exemplary embodiment of the inventive concept.

FIG. 22 is a system block diagram of an electronic device according to a sixth exemplary embodiment of the inventive concept.

Referring to FIG. 22, a semiconductor device similar to that described above with reference to FIGS. 1 to 18 may be applied to an electronic system 2100. The electronic system 2100 may include a body 2110, a micro processor unit 2120, a power unit 2130, a functional unit 2140, and a display controller unit 2150. The body 2110 may be a mother board formed of a printed circuit board (PCB). The micro processor unit 2120, the power unit 2130, the functional unit 2140, and the display controller unit 2150 may be installed in the body 2110. A display unit 2160 may be disposed inside or outside the body 2110. For example, the display unit 2160 may be disposed on a surface of the body 2110 to display an image processed by the display controller unit 2150.

The power unit 2130 may serve to supply a predetermined voltage, which is supplied from an external battery (not shown) and then branched according to a required level of voltage, to the micro processor unit 2120, the functional unit 2140, and the display controller unit 2150. The micro processor unit 2120 may receive a voltage from the power unit 2130, and it may be used to control the functional unit 2140 and the display unit 2160. The functional unit 2140 may perform various functions of the electronic system 2100. For example, when the electronic system 2100 is a mobile phone, the functional unit 2140 may include various components capable of performing a mobile function such as dialing, the output of an image to the display unit 2160 and the output of a sound to a speaker by communication with an external apparatus 2170. When a camera is installed together within the electronic system 2100, the functional unit 2140 may also serve as a camera image processor.

In some embodiments, when the electronic system 2100 is connected to a memory card in order to increase capacity, the functional unit 2140 may be a memory card controller. The functional unit 2140 may send and/or receive signals to and/or from the external apparatus 2170 through a wired or wireless communication unit 2180. Further, when the electronic system 2100 requires a universal serial bus (USB) in order to expand its function, the functional unit 2140 may serve as an interface controller.

A method of fabricating a semiconductor device similar to that described above with reference to FIGS. 1 to 18 may be applied to at least one of the micro processor unit 2120 and the functional unit 2140. For example, the functional unit 2140 may include a semiconductor device having a configuration similar to that shown in FIG. 6. In this case, the upper interconnections 75 of FIG. 6 may be electrically connected to the micro processor unit 2120 via the body 2110.

In accordance with the inventive concepts, a contact hole passing through an upper insulating layer and an etch stop layer is formed, and then deuterium is diffused into a gate dielectric layer using a deuterium annealing process. The deuterium diffused into the gate dielectric layer can serve to improve the negative bias temperature instability (NBTI) characteristics of a transistor, as discussed above.

The foregoing description is illustrative of embodiments and is not to be construed as limiting thereof. Although several embodiments have been described, those skilled in the art will readily appreciate that many modifications are possible in embodiments without materially departing from the novel teachings and advantages. Accordingly, all such modifications are intended to be included within the scope of these inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device comprising the sequential steps of:
   forming a gate dielectric layer on a first portion of a semiconductor substrate;
   forming a gate electrode on the gate dielectric layer;
   forming an etch stop layer on the gate electrode;
   forming a capacitor on a second portion of the semiconductor substrate adjacent to the gate electrode;
   forming at least a contact hole passing through the etch stop layer on the gate electrode after the step of forming the capacitor; and,
   diffusing deuterium into the gate dielectric layer through the contact hole under annealing conditions.

2. The method of claim 1, wherein a content of the deuterium in different portions of the gate dielectric layer decreases as the different portions of the gate dielectric layer are disposed further away from the contact hole.

3. The method of claim 1, wherein the step of diffusing deuterium comprises performing at least a first deuterium annealing process on the semiconductor substrate having the contact hole at a temperature ranging from about 300 ° C. to about 700 ° C.

4. The method of claim 3, further comprising the steps of:
   forming an upper plug in the contact hole; and
   performing a second deuterium annealing process on the semiconductor substrate having the upper plug.

5. The method of claim 4, wherein the upper plug is formed using a process carried out at a temperature of about 400 ° C. or less.

6. The method of claim 4, further comprising the steps of:
   forming an upper interconnection on the upper plug; and
   forming a passivation layer on the upper interconnection,
   wherein the upper interconnection and the passivation layer are formed using a process carried out at a temperature of about 400 ° C. or less.

7. The method of claim 1, further comprising a step of forming an upper insulating layer on the capacitor and the etch stop layer, and
   further wherein the contact hole passes through the upper insulating layer.

8. The method of claim 1, wherein the step of forming the capacitor comprises the sub-steps of:
   forming a storage node;
   forming a capacitor dielectric layer on the storage node; and forming a plate electrode on the capacitor dielectric layer, such that the capacitor dielectric layer is interposed between the storage node and the plate electrode.

9. The method of claim 8, wherein the sub-step of forming the capacitor dielectric layer is carried out at a temperature of about 450° C. to about 900° C., and also wherein the capacitor dielectric layer includes a silicon oxide layer, a silicon nitride layer, a silicon oxynitride layer, a high-K dielectric layer, or a combination thereof.

10. The method of claim 1, further comprising a step of forming an intermediate interconnection on the gate electrode, and
further wherein the intermediate interconnection is exposed in the contact hole.

11. The method of claim 10, wherein the intermediate interconnection includes an intermediate plug in contact with the gate electrode and also a conductive line formed on the intermediate plug.

12. The method of claim 11, further comprising a step of forming a lower etch stop layer between the gate electrode and the conductive line, and
further wherein the intermediate plug passes through the lower etch stop layer.

13. The method of claim 1, wherein the semiconductor substrate includes an N-type silicon layer, and the etch stop layer includes a nitride layer.

14. In a process of fabricating a semiconductor device that comprises at least a gate dielectric layer on a semiconductor substrate, a gate electrode on the gate dielectric layer, and an etch stop layer on the gate electrode, and further comprises a high-temperature process component that is formed at a temperature of about 450° C. or higher, the improvements comprising the sequential steps of:

(a) after forming the high-temperature process component, forming one or more contact holes that pass through the etch stop layer and extend to or into the gate dielectric layer and/or extend to interconnections or interfaces that, in turn, extend to or into the gate dielectric layer;
(b) diffusing deuterium into the gate dielectric layer at least in part through the contact hole(s); and,
a further sequence of steps selected from either steps (c1) to (g1) below or steps (c2) to (f2) below:
Steps (c1) to (g1)
(c1) forming an upper plug;
(d1) performing a second deuterium annealing step:
(e1) forming an upper interconnection;
(f1) carrying out a passivation step; and,
(g1) performing an $H_2$ annealing step;
Steps (c2) to (f2)
(c2) forming an upper plug;
(d2) forming an upper interconnection;
(e2) carrying out a passivation step; and,
(f2) performing an $H_2$ annealing step.

15. The improvement of claim 14 wherein the improvement comprises the additional steps (c1) to (g1) after step (b) of diffusing deuterium into the gate dielectric layer.

16. The improvement of claim 14 wherein the improvement comprises the additional steps (c2) to (f2) after step (b) of diffusing deuterium into the gate dielectric layer.

17. The improvement of claim 14 wherein, after step (a) but prior to step (b), there is a step of forming an upper plug.

18. The improvement of claim 14 comprising the additional step of incorporating the semiconductor device into a memory module, a data storage device, or a communication device.

* * * * *